US012598867B2

(12) United States Patent
Chei et al.

(10) Patent No.: US 12,598,867 B2
(45) Date of Patent: Apr. 7, 2026

(54) DISPLAY DEVICE

(71) Applicant: Samsung Display Co., LTD., Yongin-si (KR)

(72) Inventors: Suk Kung Chei, Suwon-si (KR); Young Gu Kim, Yongin-si (KR); Yun Hee Park, Hwaseong-si (KR); Ji Yun Park, Hwaseong-si (KR); Kyung Seon Tak, Hwaseong-si (KR); Bong Sung Seo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 668 days.

(21) Appl. No.: 17/876,114

(22) Filed: Jul. 28, 2022

(65) Prior Publication Data

US 2023/0200139 A1     Jun. 22, 2023

(30) Foreign Application Priority Data

Dec. 17, 2021     (KR) ........................ 10-2021-0181772

(51) Int. Cl.
*H10K 59/122*          (2023.01)

(52) U.S. Cl.
CPC ................................. *H10K 59/122* (2023.02)

(58) Field of Classification Search
CPC .................................................. H10K 59/122
See application file for complete search history.

(56) References Cited

U.S. PATENT DOCUMENTS

| | | | |
|---|---|---|---|
| 10,615,370 B2 | 4/2020 | Chou et al. | |
| 11,004,927 B2 | 5/2021 | Cho et al. | |
| 11,183,667 B2 | 11/2021 | Bang et al. | |
| 11,744,128 B2 | 8/2023 | Cho et al. | |
| 2017/0331058 A1* | 11/2017 | Seo | G02B 5/3016 |
| 2020/0006461 A1* | 1/2020 | Cho | H10K 59/1315 |
| 2020/0363905 A1* | 11/2020 | Jo | H10K 59/131 |
| 2020/0403180 A1* | 12/2020 | Seon | H10K 59/12 |
| 2020/0411629 A1* | 12/2020 | Kim | H10K 59/126 |
| 2021/0055816 A1* | 2/2021 | An | H10K 59/40 |
| 2021/0074955 A1* | 3/2021 | Baek | H10K 50/844 |
| 2021/0098548 A1* | 4/2021 | Ochi | H10K 59/87 |
| 2021/0126066 A1* | 4/2021 | Hwang | H10K 50/868 |
| 2021/0143368 A1* | 5/2021 | Wang | H10K 50/844 |
| 2021/0165517 A1* | 6/2021 | Lee | G06F 3/0443 |
| 2021/0175292 A1* | 6/2021 | Bang | G06F 3/0416 |
| 2021/0202630 A1* | 7/2021 | Jeon | H10K 50/844 |

(Continued)

FOREIGN PATENT DOCUMENTS

| | | | | |
|---|---|---|---|---|
| KR | 10-2015-0025994 | 3/2015 | | |
| KR | 20150027407 A | * 3/2015 | ........... | G02F 1/1339 |

(Continued)

*Primary Examiner* — Nathan W Ha
(74) *Attorney, Agent, or Firm* — Womble Bond Dickinson (US) LLP

(57) ABSTRACT

A display device includes a substrate including a display area, and a non-display area, and dams disposed in the non-display area. Each of the dams surrounds the display area, the dams include a first dam adjacent to the display area, second dams surrounding the first dam, and third dams surrounding the second dams. The second dams are spaced apart from each other, the third dams are spaced apart from each other, and opposing ends of at least one of the second dams and the third dams has a curvature.

21 Claims, 19 Drawing Sheets

RME: RME1, RME2     PX: SPX1, SPX2, SPX3
CNE: CNE1, CNE2      CFL: CF1, CF2, CF3
PRL: CPL1, LR, CPL2  CWL: WCL1, WCL2, TPL
                     CFL: CF1, CF2, CF3

(56) References Cited

U.S. PATENT DOCUMENTS

| | | | | |
|---|---|---|---|---|
| 2021/0202664 A1* | 7/2021 | Kim | ........................ | H10K 59/35 |
| 2021/0202683 A1* | 7/2021 | Lee | .................... | H10K 59/1315 |
| 2021/0202895 A1* | 7/2021 | Kang | ................... | H10K 50/844 |
| 2021/0376293 A1* | 12/2021 | Zhao | ....................... | H10K 59/00 |
| 2022/0158128 A1* | 5/2022 | Ha | ......................... | H10K 50/82 |
| 2022/0165815 A1* | 5/2022 | Han | ....................... | H10K 59/65 |
| 2022/0181417 A1* | 6/2022 | Na | ........................ | H10K 59/122 |
| 2022/0199693 A1* | 6/2022 | Wei | ..................... | H10K 59/8723 |
| 2022/0208937 A1* | 6/2022 | Oh | ......................... | H10K 59/131 |
| 2022/0231257 A1* | 7/2022 | Wang | ................. | H10K 59/879 |
| 2022/0317794 A1* | 10/2022 | Tong | ..................... | H10K 59/12 |
| 2022/0344448 A1* | 10/2022 | Zhang | ................. | H10K 59/873 |
| 2023/0263034 A1* | 8/2023 | Kim | ....................... | H10K 59/38 |
| | | | | 257/91 |
| 2023/0413654 A1* | 12/2023 | Liao | .................... | H10K 59/352 |

FOREIGN PATENT DOCUMENTS

| | | |
|---|---|---|
| KR | 10-2015-0116022 | 10/2015 |
| KR | 10-2016-0114220 | 10/2016 |
| KR | 10-2020-0003332 A | 1/2020 |
| KR | 10-2021-0046104 A | 4/2021 |

* cited by examiner

PX: SPX1, SPX2, SPX3

DISPLAY DEVICE

CROSS-REFERENCE TO RELATED APPLICATION(S)

This application claims priority to and benefits of Korean Patent Application No. 10-2021-0181772 under 35 U.S.C. 119, filed on Dec. 17, 2021, in the Korean Intellectual Property Office (KIPO), the entire contents of which are herein incorporated by reference.

BACKGROUND

Technical Field

The disclosure relates to a display device.

Description of Related Art

Display devices are of ever-increasing importance in view of the continued proliferation of multimedia. In response to this trend, various types of display devices such as an organic light-emitting display device (OLED), a liquid crystal display device (LCD), etc. have been used.

A display device that displays an image may have a display panel such as an organic light-emitting display panel or a liquid crystal display panel. The light-emitting display panel may include a light-emitting element. For example, a light-emitting diode (LED) as the light-emitting element may include an organic light-emitting diode using an organic material as a light-emitting material or an inorganic light-emitting diode using an inorganic material as the light-emitting material.

SUMMARY

An aspect of the disclosure is to provide a display device in which a dam is prevented from being peeled off.

Aspects of the disclosure are not limited to the above-mentioned aspect. Other aspects and advantages according to the disclosure that are not mentioned may be understood based on the following description, and may be more clearly understood based on embodiments according to the disclosure.

According to an embodiment of the disclosure, a display device may include a substrate including a display area, and a non-display area, and dams disposed in the non-display area. Each of the dams may surround the display area, and the dams may include a first dam adjacent to the display area, second dams surrounding the first dam, and third dams surrounding the second dams. The second dams may be spaced apart from each other, the third dams may be spaced apart from each other, and opposing ends of at least one of the second dams and the third dams may have a curvature.

In an embodiment, the first dam may extend continuously, the second dams may be arranged to be spaced apart from each other in a length direction of each of the second dams, and the third dams may be arranged to be spaced apart from each other in a length direction of each of the third dams.

In an embodiment, the display device may further include a space by which a spacing between the third dams may overlap one of the second dams in a direction perpendicular to a length direction of each of the third dams in a plan view.

In an embodiment, an overlapping length by which the spacing between the third dams overlaps the second dam may be in a range of about 1% to about 50% of the spacing between the third dams.

In an embodiment, opposing ends of each of the second dams may have a curvature, and opposing ends of each of the third dams may have a curvature.

In an embodiment, each of the second dams may have a rectangular shape in a plan view, and opposing ends of each of the third dams may have a curvature.

In an embodiment, the first dam, each of the second dams and each of the third dams may have a same width and a same vertical dimension.

In an embodiment, each of the second dams and each of the third dams may have different widths, and the width of each of the second dams may be smaller than the width of each of the third dams.

In an embodiment, each of the second dams may have a circular shape in a plan view, and opposing ends of each of the third dams may have a curvature.

In an embodiment, the device may further include fourth dams surrounding the third dams and spaced apart from each other, and fifth dams surrounding the fourth dams and spaced apart from each other.

In an embodiment, a spacing between the fourth dams may overlap one of the third dams in a direction perpendicular to a length direction of each of the third dams, and a spacing between the fifth dams may overlap one of the fourth dams in a direction perpendicular to a length direction of each of the third dams.

In an embodiment, a side of one of the fourth dams may be aligned with a side of one of the second dams in a direction perpendicular to a length direction of each of the fourth dams, and a side of one of the fifth dams may be aligned with a side of one of the third dams in a direction perpendicular to a length direction of each of the fifth dams.

In an embodiment, each of the fourth dams and each of the second dams may have a same length, a same vertical dimension and a same width, and each of the fifth dams and each of the third dams may have a same length, a same vertical dimension and a same width.

According to an embodiment of the disclosure, a display device may include a substrate including a display area, and a non-display area, and dams disposed in the non-display area. Each of the dams may surround the display area, the dams may include a first dam adjacent to the display area, second dams surrounding the first dam, and third dams surrounding the second dams. The second dams may be spaced apart from each other, the third dams may be spaced apart from each other, the first dam may extend continuously, the second dams may be arranged to be spaced apart from each other, and the third dams are arranged to be spaced apart from each other.

In an embodiment, the display area may include pixels that each include sub-pixels. Each of the sub-pixels may include a first electrode and a second electrode that are spaced apart from each other, a light-emitting element disposed on the first electrode and the second electrode, a first connective electrode contacting an end of the light-emitting element, a second connective electrode contacting another end of the light-emitting element, a first bank defining each of the sub-pixels, and a second bank disposed on the first bank.

In an embodiment, the first dam, each of the second dams and each of the third dams may be composed of a single layer, and the first dam, each of the second dams and each of the third dams may include, and the second bank may include a same material.

In an embodiment, the first dam, each of the second dams and each of the third dams may be formed of multi layers including a lower dam layer, and an upper dam layer disposed on the lower dam layer.

In an embodiment, the lower dam layer and the first bank may include a same material, and the upper dam layer and the second bank may include a same material.

In an embodiment, the light-emitting element may include a first semiconductor layer, a second semiconductor layer disposed on the first semiconductor layer, and a light-emitting layer disposed between the first semiconductor layer and the second semiconductor layer.

In an embodiment, the device may further include an upper substrate facing away from the substrate, and a bonding member for bonding the substrate and the upper substrate to each other. The bonding member may overlap at least one of the first dam, each of the second dams, and each of the third dams.

According to the display device according to the embodiments, the first dam adjacent to the display area may extend continuously, and the second dams and the third dams may overlap each other in a direction, thereby preventing an organic material from spreading from the display area to an unwanted area of the non-display area.

Further, each of opposing ends of each of the second dams and the third dams may be formed to have a curvature, thereby preventing the second dams and the third dams from being peeled-off due to high-pressure cleaning.

Effects of the disclosure are not limited to the above-mentioned effects, and other effects not mentioned will be clearly understood by those skilled in the art from the following descriptions.

BRIEF DESCRIPTION OF THE DRAWINGS

The above and other aspects and features of the disclosure will become more apparent by describing in detail embodiments thereof with reference to the attached drawings, in which:

FIG. 5 is a cross-sectional view taken along line Q4-Q4' in FIG. 3;

FIG. 18 is a cross-sectional view schematically showing a cross-sectional structure of a display device according to still yet another embodiment.

DETAILED DESCRIPTION OF THE EMBODIMENTS

Figure 1:
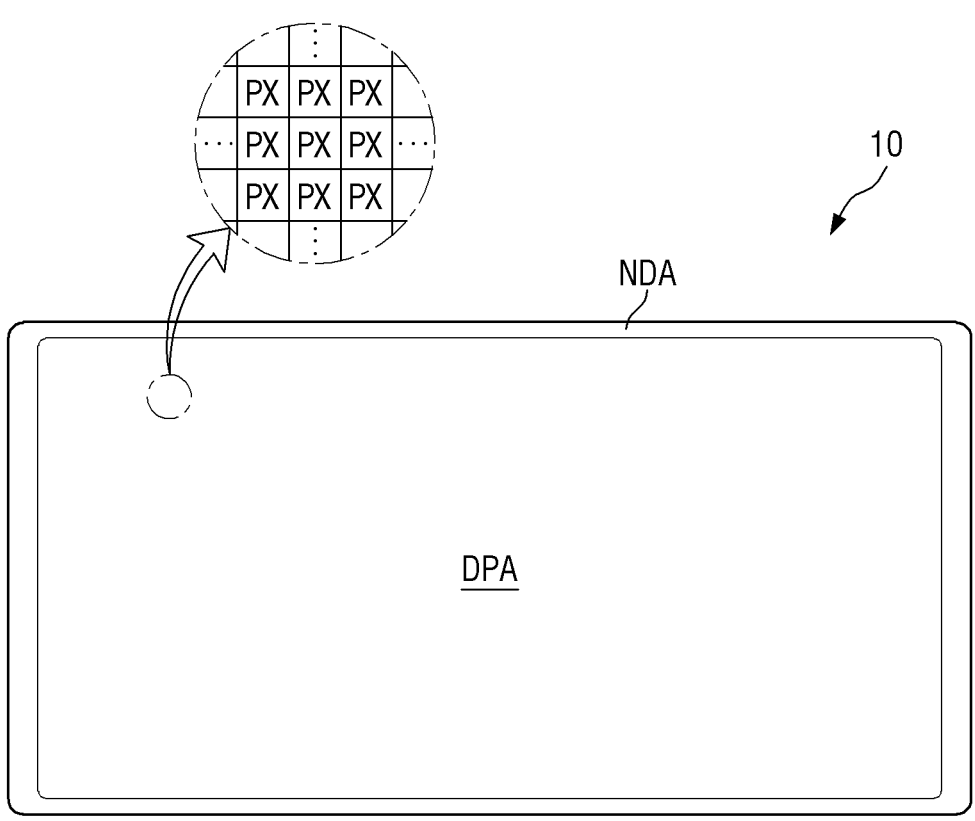
FIG. 1 is a schematic plan view showing a display device according to an embodiment.
Figure 1:
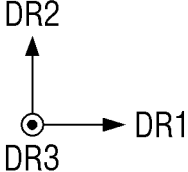

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving may be possible. Embodiments may be implemented independently of each other or may be implemented together in an association.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display device according to an embodiment.

Referring to FIG. 1, a display device 10 displays a video or a still image. The display device 10 may refer to any electronic device that provides a display screen. For example, the display device 10 may include a television, a laptop, a monitor, a billboard, an Internet of Things device, a mobile phone, a smart phone, a tablet PC (personal computer), an electronic watch, a smart watch, a watch phone, a head mounted display (HMD), a mobile communication terminal, an electronic notebook, an e-book, a PMP (Portable Multimedia Player), a navigation device, a game device, a digital camera, a camcorder, etc. which may provide a display screen.

The display device 10 may include a display panel that provides a display screen. Examples of the display panel may include an inorganic light-emitting diode display panel, an organic light-emitting display panel, a quantum dot light-emitting display panel, a plasma display panel, and a field emission display panel. Hereinafter, an example in which the inorganic light-emitting diode display panel is embodied as the display panel will be described. However, the disclosure is not limited thereto. The disclosure may also be applied to the other display panels.

Hereinafter, in the drawings of the embodiment for describing the display device 10, a first direction DR1, a second direction DR2, and a third direction DR3 may be defined. The first direction DR1 and the second direction DR2 may be perpendicular to each other and constitute a plane. The third direction DR3 may be normal to the plane which the first direction DR1 and the second direction DR2 constitute. The third direction DR3 may be perpendicular to each of the first direction DR1 and the second direction DR2. In an embodiment describing the display device 10, the third direction DR3 may indicate a thickness direction of the display device 10.

The display device 10 may have a rectangular shape including a long side and a short side where the long side extends in the first direction DR1 and the short side extends in the second direction DR2 in a plan view. A corner portion where the long side and the short side of the display device 10 meet may have a right angle in a plan view. However, the disclosure is not limited thereto. The corner portion may have a rounded shape. A planar shape of the display device 10 is not limited to the illustrated display device, and may have other shapes such as a square, a rectangular shape with rounded corners, other polygons, and a circle.

A display face of the display device 10 may be defined as a side thereof in the third direction DR3 as the thickness direction. In embodiments for describing the display device 10, unless otherwise stated, "upward direction" may indicate a display direction toward a side in the third direction DR3, and "top face" may indicate a face facing toward a side in the third direction DR3. Further, in embodiments for describing the display device 10, unless otherwise stated, "downward direction" may refer to a direction toward an opposite side in the third direction DR3, thus, indicates an opposite direction to the display direction, and "bottom face" may refer to a face facing toward an opposite side in the third direction DR3. Further, "left", "right", "top" and "bottom" may indicate directions of the display device 10 in a plan view. For example, "right" may indicate a direction toward a side in the first direction DR1, "left" may indicate a direction toward the opposite side in the first direction DR1, "top" indicates a direction toward a side in the second direction DR2, and "bottom" may indicate a direction toward the opposite side in the second direction DR2.

The display device 10 may include a display area DPA and a non-display area NDA. The display area DPA may refer to an area where a screen may be displayed, while the non-display area NDA may refer to an area where the screen may not be displayed.

A shape of the display area DPA may conform to a shape of the display device 10. For example, the shape of the display area DPA may have a rectangular shape in a plan view. The display area DPA may occupy generally an inner region of the display device 10.

The display area DPA may include pixels PX. The pixels PX may be arranged in a matrix form. A shape of each pixel PX may be rectangular or square in a plan view. However, the disclosure is not limited thereto. The shape thereof may be a rhombus shape in which each side is inclined relative to a direction. The pixels PX may be alternatively arranged in a stripe type or a PenTile® type.

The non-display area NDA may be disposed around the display area DPA. The non-display area NDA may completely or partially surround the display area DPA. In an embodiment, the display area DPA may have a rectangular shape, while each non-display area NDA may be disposed adjacent to each of four sides of the display area DPA. The non-display area NDA may constitute a bezel of the display device 10. Lines and circuit drivers included in the display device 10, or a pad on which an external device is mounted may be disposed in the non-display area NDA.

Figure 2:
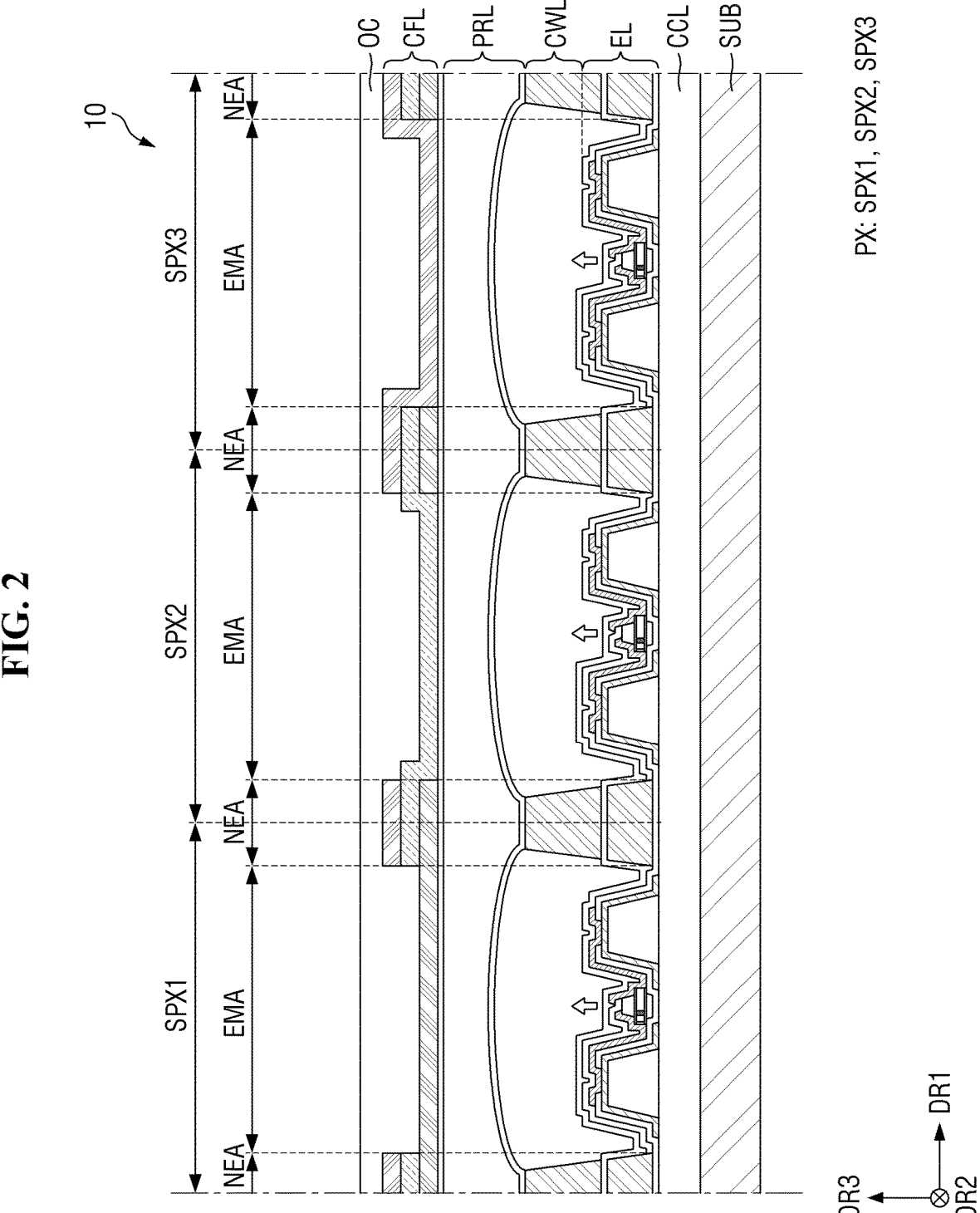
FIG. 2 is a schematic cross-sectional view of a display device according to an embodiment.

FIG. 2 is a schematic cross-sectional view of a display device according to an embodiment.

Referring to FIG. 2, each of the pixels PX may include sub-pixels SPX1, SPX2, and SPX3. For example, a pixel PX may include the first sub-pixel SPX1, the second sub-pixel SPX2 and the third sub-pixel SPX3. The first sub-pixel SPX1 may emit light of a first color, the second sub-pixel SPX2 may emit light of a second color, and the third sub-pixel SPX3 may emit light of a third color. The first color may be red, the second color may be green, and the third color may be blue. FIG. 2 illustrates that the pixel PX includes the three sub-pixels SPX1, SPX2, and SPX3. However, the disclosure is not limited thereto. The pixel PX may include a different (e.g., larger) number of sub-pixels.

Each of the sub-pixels SPX1, SPX2, and SPX3 of display device 10 may include a light-emitting area EMA and a non-light-emitting area NEA. The light-emitting area EMA may be an area where a light-emitting element layer EL may be disposed and light of a specific wavelength may be emitted, and the non-light-emitting area NEA may be an area where the light-emitting element layer EL may not be disposed and which the light may not reach and from which the light may not emitted.

The display device 10 may include a substrate SUB, and a light-emitting element layer EL, a wavelength control layer CWL, a protective layer PRL and a color filter layer CFL disposed on the substrate SUB. Further, the display device 10 may further include a circuit layer CCL disposed between the substrate SUB and the light-emitting element layer EL. The circuit layer CCL, the light-emitting element layer EL, the wavelength control layer CWL, the protective layer PRL, and the color filter layer CFL may be sequentially disposed on the substrate SUB.

A first bank BNL1 may be disposed at a boundary of adjacent ones of the sub-pixels SPX1, SPX2, and SPX3. The light-emitting element layer EL may be disposed in each of the sub-pixels SPX1, SPX2, and SPX3 defined by the first bank BNL1. The light-emitting element layer EL may be disposed between the circuit layer CCL and the wavelength control layer CWL disposed on the substrate SUB and may include light-emitting elements ('ED' in FIG. 3) to emit light of a specific wavelength. The light may be incident on the color filter layer CFL via the wavelength control layer CWL.

The display device 10 according to an embodiment may be embodied as a top emission type display device in which light emits light upwardly of the substrate SUB on which the light-emitting element layer EL may be disposed. The light emitted from the light-emitting element layer EL may travel downwardly of the substrate SUB. However, the light may be reflected from a structure in the light-emitting element layer EL or a structure of the circuit layer CCL and may be emitted upwardly of the substrate SUB. The display device 10 may be embodied as a top emission type display device including layers sequentially disposed on the substrate SUB and thus including only one substrate.

Hereinafter, with further reference to other drawings, the display device 10 including the light-emitting element layer EL, the wavelength control layer CWL, the protective layer PRL, and the color filter layer CFL will be described in detail.

Figure 3:
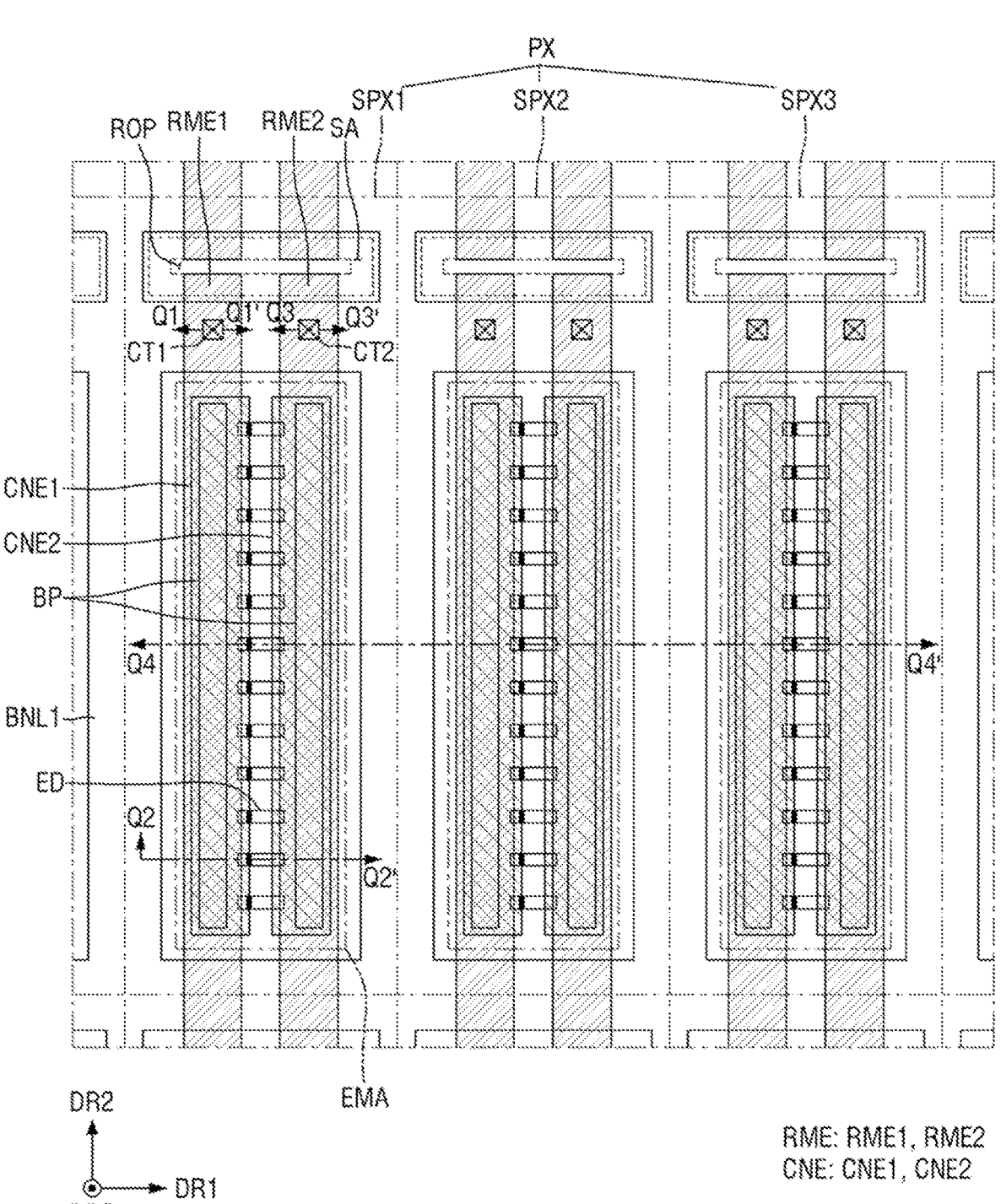
FIG. 3 is a schematic plan view showing a light-emitting element layer disposed in a pixel of a display device according to an embodiment.
Figure 4:
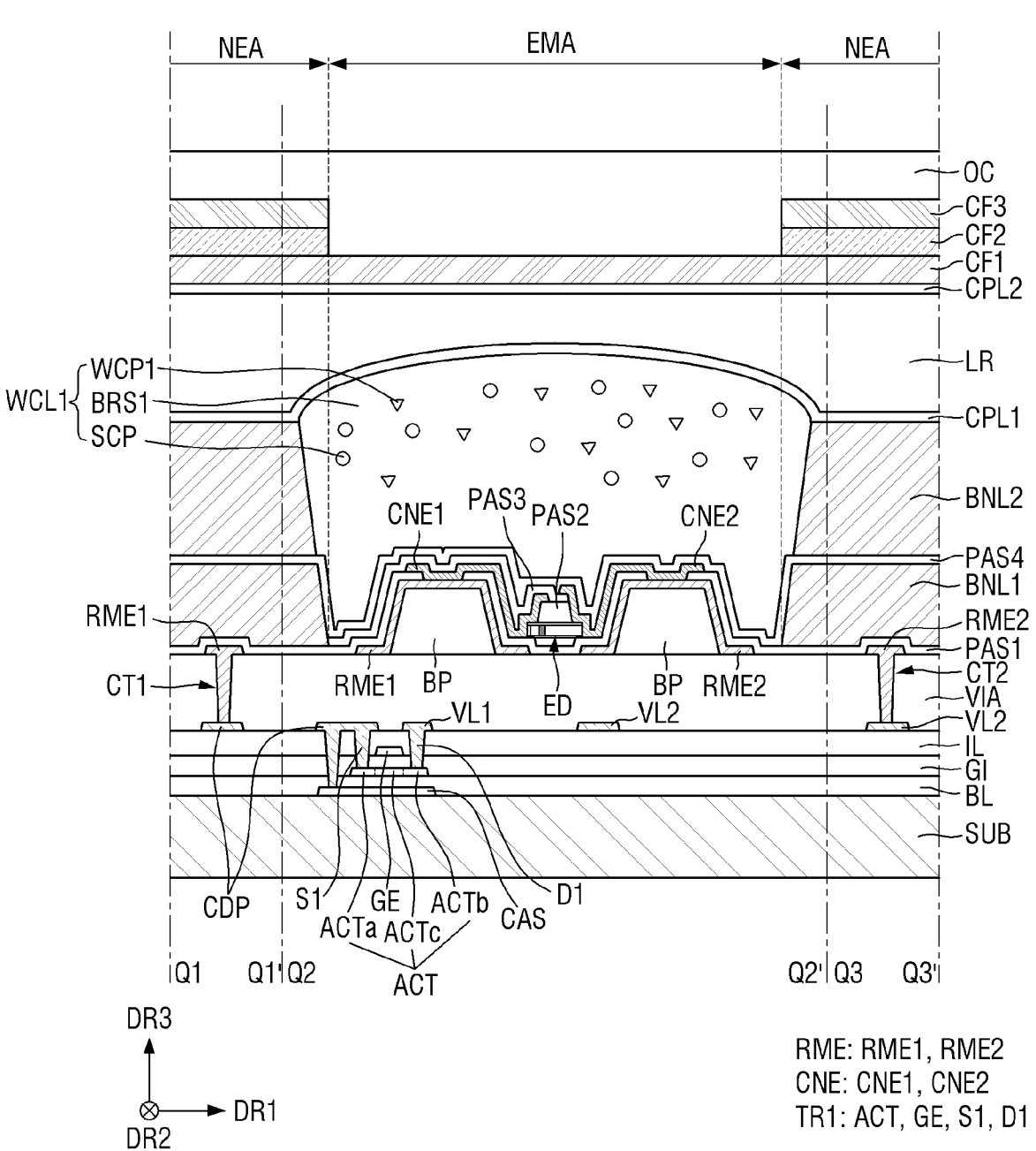
FIG. 4 is a cross-sectional view taken along lines Q1-Q1', Q2-Q2' and Q3-Q3' of FIG. 3.
Figure 5:
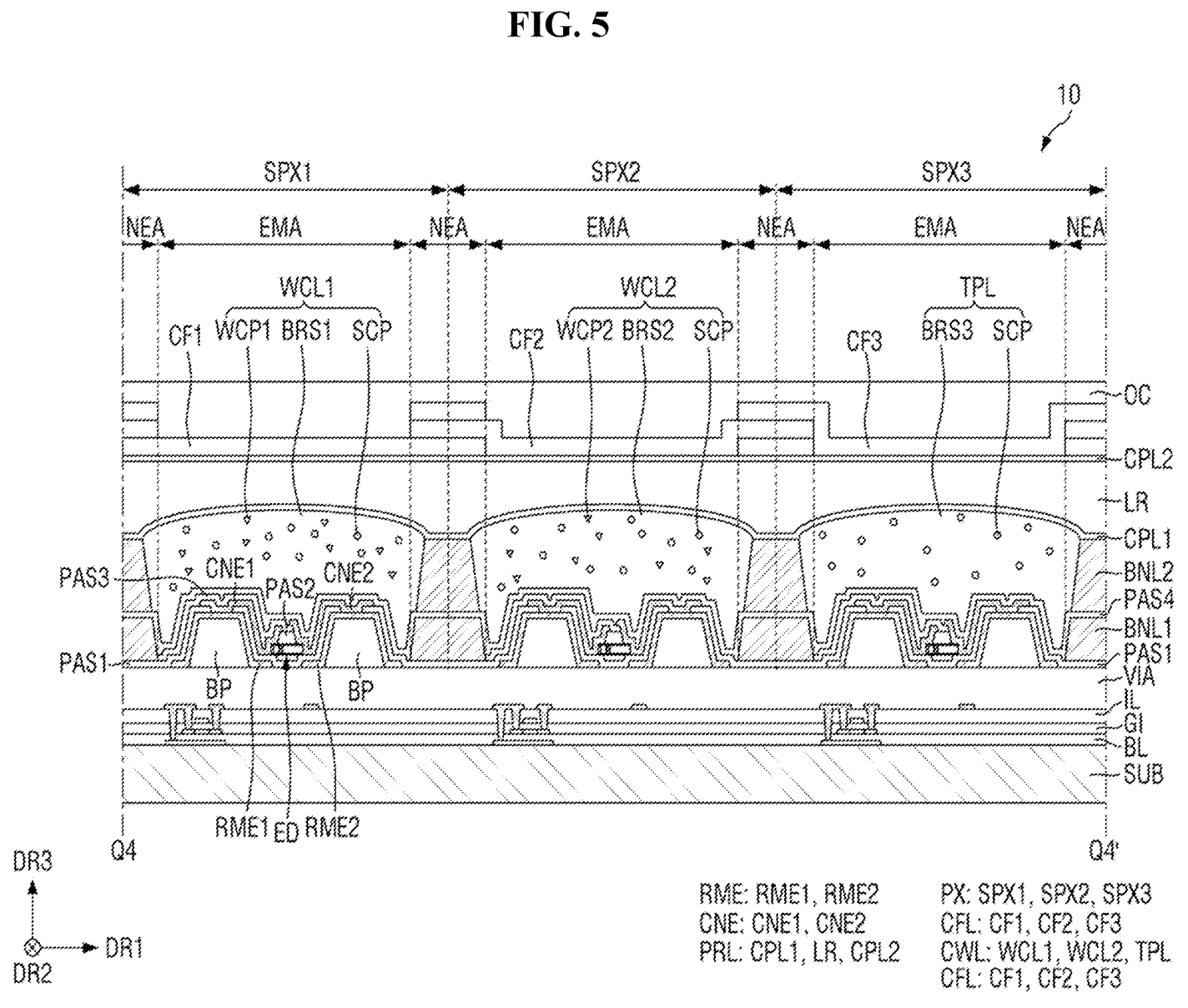
Figure 6:
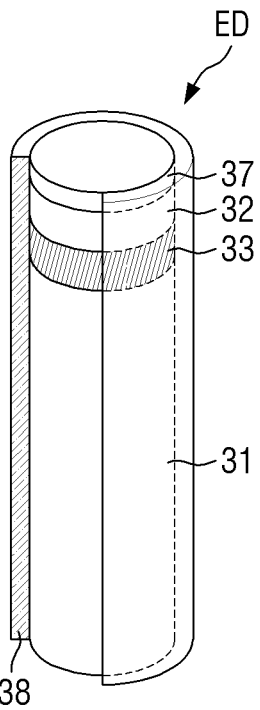
FIG. 6 is a perspective view schematically showing a light-emitting element of a display device according to an embodiment.

FIG. 3 is a schematic plan view showing a light-emitting element layer disposed in a pixel of a display device according to an embodiment. FIG. 4 is a cross-sectional view taken along lines Q1-Q1', Q2-Q2' and Q3-Q3' of FIG. 3. FIG. 5 is a cross-sectional view taken along a line Q4-Q4' in FIG. 3. FIG. 6 is a perspective view schematically showing a light-emitting element of a display device according to an embodiment.

FIG. 3 shows the light-emitting element layer EL, FIG. 4 shows a cross section across the first sub-pixel SPX1, and FIG. 5 shows a cross section across the first to third sub-pixels SPX1, SPX2, and SPX3.

Referring to FIG. 3 to FIG. 5 in conjunction with FIG. 2, the first bank BNL1 is disposed at the boundary between adjacent ones of the sub-pixels SPX1, SPX2, and SPX3. The first bank BNL1 may extend in the first direction DR1 and the second direction DR2, may surround each of the sub-pixels SPX1, SPX2, and SPX3, and may distinguish neighboring ones of the sub-pixels SPX1, SPX2, and SPX3 from each other.

Each of the sub-pixels SPX1, SPX2, and SPX3 may include a non-light-emitting area NEA and a light-emitting area EMA. Further, each of the sub-pixels SPX1, SPX2, and SPX3 may include a sub-area SA disposed in the non-light-emitting area NEA. The sub-area SA may be disposed on a side in the second direction DR2 of the light-emitting area EMA. The sub-area SA may be disposed between light-emitting areas EMA of sub-pixels neighboring to each other in the second direction DR2. Multiple light-emitting areas EMA and multiple sub-areas SA may be arranged in the display area DPA of the display device 10. For example, the light-emitting areas EMA and the sub-areas SA may be repeatedly arranged in the first direction DR1. The light-emitting areas EMA and the sub-areas SA may be alternately arranged with each other in the second direction DR2.

The first bank BNL1 may be disposed between each of the sub-areas SA and each of the light-emitting areas EMA. A spacing therebetween may vary based on a width of the first bank BNL1 in each of the first direction DR1 and the second direction DR2. Light may not be emitted from the sub-area SA because the light-emitting element ED may not be disposed in the sub-area SA. However, a portion of each of electrodes RME: RME1 and RME2 disposed in each of the sub-pixels SPX1, SPX2, and SPX3 may be disposed in the sub-area SA. The electrodes RME disposed in each of the sub-pixels SPX1, SPX2, and SPX3 may be spaced from each other in the sub-area SA.

The substrate SUB may be an insulating substrate. The substrate SUB may be made of a transparent insulating material such as glass, quartz, or polymer resin. Further, the substrate SUB may be a rigid substrate, or may be a flexible substrate capable of bending, folding, rolling, etc.

The circuit layer CCL may be disposed on the substrate SUB. The circuit layer CCL may include a first conductive layer, a semiconductor layer, a second conductive layer, and a third conductive layer, and insulating layers respectively disposed therebetween. The drawing discloses that only one first transistor TR1 and some lines are disposed in the circuit layer CCL. However, the disclosure is not limited thereto. The circuit layer CCL of the display device 10 may include further lines, electrodes, and semiconductor layers, and thus may include a larger number of transistors in addition to the first transistor TR1. The circuit layer CCL may include a capacitor. For example, the display device 10 may include one or more transistors in addition to the first transistor TR1 and thus include 2, 3, 6, or 7 transistors per each of the sub-pixels SPX1, SPX2, and SPX3.

A first conductive layer CAS may be disposed on the substrate SUB. The first conductive layer CAS may overlap an active layer ACT of the first transistor TR1 of display device 10. The first conductive layer CAS may include a material that blocks light, so that light may be prevented from entering the active layer ACT of the first transistor. In an example, the first conductive layer CAS may be made of an opaque metal material that blocks light transmission therethrough. However, the disclosure is not limited thereto, and in some cases, the first conductive layer CAS may be omitted.

A buffer layer BL may be disposed on the first conductive layer CAS and an entirety of the substrate SUB. The buffer layer BL may be formed on the substrate SUB to protect the first transistor TR1 of each of the sub-pixels SPX1, SPX2, and SPX3 from moisture passing through the substrate SUB, which may be vulnerable to moisture permeation, and may perform a face planarization function. The buffer layer BL may include inorganic layers alternately stacked on each other. For example, the buffer layer BL may be embodied as a double layer in which inorganic layers including at least one of silicon oxide ($SiO_x$), silicon nitride ($SiN_x$), and silicon oxynitride ($SiO_xN_y$) are stacked on each other, or a multilayer in which these layers are alternately stacked on each other. In other embodiments, each of the layers may be composed of one inorganic layer including the materials.

The semiconductor layer may be disposed on the buffer layer BL. The semiconductor layer may include the active layer ACT of the first transistor TR1. The active layer may partially overlap a gate electrode GE of a second conductive layer, which will be described later.

In an embodiment, the semiconductor layer may include polycrystalline silicon, single crystal silicon, oxide semiconductor, and the like, or a combination thereof. In case that the semiconductor layer includes the oxide semiconductor, each active layer ACT may include conductive areas ACTa and ACTb and a channel area ACTc therebetween. The oxide semiconductor may be an oxide semiconductor containing indium (In). In some embodiments, the oxide semiconductor may include Indium-Tin Oxide (ITO), Indium-Zinc Oxide (IZO), Indium-Gallium Oxide (IGO), Indium-Zinc-Tin (IZTO), Indium-Gallium-Zinc Oxide (IGZO), Indium-Gallium-Tin Oxide (IGTO), Indium-Gallium-Zinc-Tin Oxide (IGZTO), etc., or a combination thereof.

In another embodiment, the semiconductor layer may include polycrystalline silicon. The polycrystalline silicon may be produced by crystallizing amorphous silicon. The conductive area of the active layer ACT may be a doped area doped with impurities.

A gate insulating layer GI may be disposed on the semiconductor layer and the buffer layer BL. The gate insulating layer GI may function as a gate insulating film of each transistor. The gate insulating layer GI may be embodied as a double layer in which inorganic layers including at least one of silicon oxide (SiOx), silicon nitride (SiNx), and silicon oxynitride (SiOxNy) may be stacked on each other or a multilayer in which these layers may be alternately stacked on each other. In other embodiments, each of the layers may be composed of one inorganic layer including the materials.

The second conductive layer may be disposed on the gate insulating layer GI. The second conductive layer may include a gate electrode GE of the first transistor TR1. The gate electrode GE may overlap, in a thickness direction, with the channel area ACTc of the active layer ACT. The second conductive layer may be embodied as a single layer or multiple layers made of at least one of molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

An interlayer insulating layer IL may be disposed on the second conductive layer. The interlayer insulating layer IL may be disposed to cover the second conductive layer and perform a function of protecting the second conductive layer. The interlayer insulating layer IL may be embodied as a double layer in which inorganic layers including at least one of silicon oxide (SiOx), silicon nitride (SiNx), and silicon oxynitride (SiOxNy) may be stacked on each other or a multilayer in which these layers are alternately stacked on each other. In other embodiments, each of the layers may be composed of one inorganic layer including the materials.

A third conductive layer may be disposed on the interlayer insulating layer IL. The third conductive layer may include a source electrode S1 and a drain electrode D1 of the first transistor TR1, a first voltage line VL1, a second voltage line VL2, and a conductive pattern CDP.

The source electrode S1 and the drain electrode D1 of the first transistor TR1 may contact the conductive areas ACTa and ACTb of the active layer ACT via contact holes extending through the interlayer insulating layer IL and the gate insulating layer GI, respectively. Further, the source electrode S1 of the first transistor TR1 may be electrically connected to the first conductive layer CAS via another contact hole.

A high potential voltage (or a first power voltage) to be delivered to the first electrode RME1 may be applied to the first voltage line VL1. A low potential voltage (or a second power voltage) to be delivered to the second electrode RME2 may be applied to the second voltage line VL2. A portion of the first voltage line VL1 may contact the active layer ACT of the first transistor TR1 via a contact hole extending through the interlayer insulating layer IL and the gate insulating layer GI. The first voltage line VL1 may serve as the drain electrode D1 of the first transistor TR1. The first voltage line VL1 may be electrically connected to the first electrode RME1 to be described later. The second voltage line VL2 may be directly connected to the second electrode RME2, which will be described later.

The conductive pattern CDP may be connected to the active layer ACT of the first transistor TR1 via a contact hole that extends through the interlayer insulating layer IL and the gate insulating layer GI. The conductive pattern CDP may serve as the source electrode S1 of the first transistor TR1.

The third conductive layer may be embodied as a single layer or multiple layers made of at least one of molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

A via layer VIA may be disposed on the third conductive layer. The via layer VIA may include an organic insulating material such as polyimide (PI) and may perform a face planarization function.

The light-emitting element layer EL may be disposed on the via layer VIA. The light-emitting element layer EL may include the electrodes RME; RME1 and RME2, bank patterns BP, the first bank BNL1, a second bank BNL2, the light-emitting elements ED and connective electrodes CNE: CNE1 and CNE2. Further, insulating layers PAS1, PAS2, PAS3, and PAS4 may be disposed on the via layer VIA.

The bank patterns BP may be directly disposed on the via layer VIA. The bank patterns BP may have a shape extending in the second direction DR2 and may be received in each of the sub-pixels SPX1, SPX2, and SPX3. The bank pattern BP in a corresponding sub-pixel may not extend to another sub-pixel SPX1, SPX2, or SPX3 neighboring to the corresponding sub-pixel in the second direction DR2. The bank pattern BP may be disposed in the light-emitting area EMA. Further, the bank patterns BP may be spaced apart from each other in the first direction DR1. The light-emitting elements ED may be arranged between the bank patterns BP.

The bank patterns BP may be disposed per each of the sub-pixels SPX1, SPX2, and SPX3 and may constitute a linear pattern in the display area DPA of the display device 10. Although two bank patterns BP are shown in the drawing, the disclosure is not limited thereto. A larger number of bank patterns BP may be present based on the number of electrodes RME1 and RME2.

The bank pattern BP may have a structure in which at least a portion thereof protrudes from a top face of the via layer VIA. The protruding portion of the bank pattern BP may have an inclined side face. The light emitted from the light-emitting element ED may be reflected from the electrodes RME disposed on the bank pattern BP and may be emitted upwardly of the via layer VIA. The bank patterns BP may define an area therebetween in which the light-emitting element ED is disposed and, at the same time, may perform a function of a reflective partitioning wall that reflects the light emitted from the light-emitting element ED upwardly. A side face of the bank pattern BP may be inclined in a linear shape. However, the disclosure is not limited thereto, and an outer face of the bank pattern BP may have a semi-circle or a semi-elliptical shape. The bank pattern BP may include, but is not limited to, an organic insulating material such as polyimide (PI).

The electrodes RME may be disposed on the bank pattern BP and the via layer VIA. The electrodes RME may include the first electrode RME1 and the second electrode RME2. Each of the first electrode RME1 and the second electrode RME2 may extend in the second direction DR2. The first electrode RME1 and the second electrode RME2 may be spaced apart from each other in the first direction DR1.

Each of the first electrode RME1 and the second electrode RME2 may extend in the second direction DR2 and in each of the sub-pixels SPX1, SPX2, and SPX3. Each of the first electrode RME1 and the second electrode RME2 of a sub-pixel may be spaced apart from each of the first electrode RME1 and the second electrode RME2 of another sub-pixel adjacent thereto in the second direction in the sub-area SA of a sub-pixel. For example, the sub-area SA is disposed between light-emitting areas EMA of two sub-pixels neighboring to each other in the second direction DR2. Each of the first electrode RME1 and the second electrode RME2 of a sub-pixel may be spaced apart from each of the first electrode RME1 and the second electrode RME2 of another sub-pixel adjacent thereto in the second direction DR2 via a separation portion ROP located in the sub-area SA of a sub-pixel. However, the disclosure is not limited thereto. Some electrodes RME1 and RME2 may extend in a continuous manner across the sub-pixels neighboring to each other in the second direction DR2. In other embodiments, only one of the first electrode RME1 and the second electrode RME2 in a sub-pixel may be spaced apart from only one of the first electrode RME1 and the second electrode RME2 of another sub-pixel adjacent thereto in the second direction DR2 via the separation portion ROP located in the sub-area SA of a sub-pixel.

The first electrode RME1 may be electrically connected to the first transistor TR1 via a first electrode contact hole CT1, while the second electrode RME2 may be electrically connected to the second voltage line VL2 via a second electrode contact hole CT2. For example, the first electrode RME1 may be electrically connected to the conductive pattern CDP via the first electrode contact hole CT1 extending through the via layer VIA, wherein the first electrode contact hole CT1 may be disposed in an area overlapping the first bank BNL1, and between the sub-area SA and the light-emitting area EMA. the second electrode RME2 may be electrically connected to the second voltage line VL2 via the second electrode contact hole CT2 extending through the via layer VIA, wherein the second electrode contact hole CT2 may be disposed in an area overlapping the first bank BNL1, and between the sub-area SA and the light-emitting area EMA. However, the disclosure is not limited thereto. In another embodiment, each of the first electrode contact hole CT1 and the second electrode contact hole CT2 may be disposed in the sub-area SA.

The first electrode contact hole CT1 may connect the first electrode RME1 to the conductive pattern CDP. A signal for aligning the light-emitting elements ED may be applied to the first voltage line VL1 and applied to the first electrode RME1 via the first transistor TR1 and the conductive pattern CDP. The second electrode contact hole CT2 may connect the second electrode RME2 to the second voltage line VL2. The second power voltage may be applied to the second electrode RME2 via the second voltage line VL2. After the light-emitting elements ED have been aligned with each other, each of the first electrode RME1 and the second electrode RME2 in a sub-pixel may be spaced from each of the first electrode RME1 and the second electrode RME2 in another sub-pixel adjacent thereto in the second direction via the separation portion ROP, so that the second electrode RME2 may not receive a signal from the second voltage line VL2.

In the drawing, it is disclosed that one first electrode RME1 and one second electrode RME2 are disposed in each of the sub-pixels SPX1, SPX2, and SPX3. However, the disclosure is not limited thereto. The number of the first electrodes RME1 and the number of the second electrodes RME2 disposed in each of the sub-pixels SPX1, SPX2, and SPX3 may be greater. Further, each of the first electrode RME1 and the second electrode RME2 disposed in each of the sub-pixels SPX1, SPX2, and SPX3 may not necessarily have a shape extending in a direction, and each of the first electrode RME1 and the second electrode RME2 may have various structures. For example, each of the first electrode RME1 and the second electrode RME2 may have a partially curved or bent shape. In other embodiments, one of the first electrode RME1 and the second electrode RME2 may surround the other thereof.

The first electrode RME1 and the second electrode RME2 may be directly disposed on the bank patterns BP, respectively. Each of the first electrode RME1 and the second electrode RME2 may be formed to have a greater width than a width of each of the bank patterns BP. For example, each of the first electrode RME1 and the second electrode RME2 may cover an outer face of each of the bank patterns BP. Each of the first electrode RME1 and the second electrode RME2 may be disposed on a side face of each of the bank patterns BP. A spacing between the first electrode RME1 and the second electrode RME2 may be smaller than a spacing between the corresponding two bank patterns BP. Further, a least a portion of the first electrode RME1 and at least a portion of the second electrode RME2 may be disposed directly on the via layer VIA and thus may be coplanar with each other. However, the disclosure is not limited thereto. In some cases, a width of each of the first electrode RME1 and the second electrode RME2 may be smaller than that of each of the bank patterns BP. However, each of the first electrode RME1 and the second electrode RME2 may be disposed to cover at least a side face of each of the bank patterns BP and thus may reflect light emitted from the light-emitting element ED.

Each of the first electrode RME1 and the second electrode RME2 may include a highly reflective conductive material. For example, each of the first electrode RME1 and the second electrode RME2 may include a material having high reflectivity such as a metal including silver (Ag), copper (Cu), or aluminum (Al) or an alloy including aluminum (Al), nickel (Ni), lanthanum (La), and the like, or a combination thereof. The first electrode RME1 and the second electrode RME2 may reflect light emitting from the light-emitting element ED and traveling to a side face of the bank pattern BP toward a top of each of the sub-pixels SPX1, SPX2, and SPX3.

However, the disclosure is not limited thereto. Each of the first electrode RME1 and the second electrode RME2 may further include a transparent conductive material. For example, each of the first electrode RME1 and the second electrode RME2 may include a material such as ITO (Indium Tin Oxide), IZO (Indium Zinc Oxide), ITZO (Indium Tin-Zinc Oxide), or the like. In some embodiments, each of the first electrode RME1 and the second electrode RME2 may have a structure in which at least one layer made of a transparent conductive material and at least one layer made of a metal having high reflectivity may be stacked one on top of another, or may be composed as a single layer including the transparent conductive material and the metal having high reflectivity. For example, each of the first electrode RME1 and the second electrode RME2 may have a stack structure such as ITO/silver (Ag)/ITO, ITO/Ag/IZO, or ITO/Ag/ITZO/IZO.

The first electrode RME1 and the second electrode RME2 may be utilized to generate an electric field in each of the sub-pixels SPX1, SPX2, and SPX3 to align the light-emitting elements ED with each other. The light-emitting elements ED may be aligned with each other via an electric field generated between the first electrode RME1 and the second electrode RME2 while being arranged between the first electrode RME1 and the second electrode RME2. The light-emitting elements ED of the display device 10 may be sprayed onto the electrodes RME using an inkjet printing process. In case that ink containing the light-emitting elements ED has been sprayed onto the electrodes RME, an alignment signal is applied to the first electrode RME1 and the second electrode RME2 to generate the electric field therebetween. A voltage may be applied to the first electrode RME1 and the second electrode RME2 via the first voltage line VL1 and the second voltage line VL2 so that the light-emitting elements ED may be aligned with each other. The light-emitting elements ED dispersed in the ink may be aligned with each other under a dielectrophoretic force due to the electric field generated between the electrodes RME.

The electrodes RME respectively disposed in different sub-pixels adjacent to each other in the second direction DR2 may be spaced apart from each other via the separation portion ROP of the sub-area SA. This arrangement of the electrodes RME may be achieved by forming a single electrode line extending in the second direction DR2, and aligning the light-emitting elements ED with each other, and dividing the single electrode line into two portions spaced from each other in a subsequent process. The electrode line may be utilized to generate an electric field in the sub-pixels to align the light-emitting elements ED with each other during the manufacturing process of the display device 10. After aligning the light-emitting elements ED with each other, the electrode line may be divided into two portions spaced from each other via the separation portion ROP to form the electrodes RMEs spaced apart from each other in the second direction DR2.

The first insulating layer PAS1 may be disposed on the via layer VIA, the bank patterns BP and the electrodes RME1 and RME2. The first insulating layer PAS1 may be disposed on the via layer VIA so as to cover the electrodes RME1 and RME2 and the bank patterns BP. The first insulating layer PAS1 may be disposed in the sub-area SA, but may not be disposed in the separation portion ROP via which the electrodes RME1 and RME2 may be spaced apart from each other. The first insulating layer PAS1 may protect the electrodes RME1 and RME2 and simultaneously insulate the different electrodes RME1 and RME2 from each other. Further, the first insulating layer PAS1 may prevent a light-emitting element ED disposed thereon from being damaged due to direct contact thereof with other members.

In an embodiment, the first insulating layer PAS1 may have a step such that a portion of a top face of the first insulating layer PAS1 between the electrodes RME1 and RME2 spaced apart from each other in the first direction DR1 may be depressed. The light-emitting element ED may be disposed on the top face of the first insulating layer PAS1 where the step of the first insulating layer PAS1 may be formed. A space may be formed between the light-emitting element ED and the first insulating layer PAS1.

The first bank BNL1 may be disposed on the first insulating layer PAS1. The first bank BNL1 may extend in the first direction DR1 and the second direction DR2 and thus may have a grid pattern in a plan view. The first bank BNL1 may be disposed at a boundary between adjacent ones of the sub-pixels SPX1, SPX2, and SPX3 so as to distinguish neighboring sub-pixels SPX1, SPX2, and SPX3 from each other. Further, the first bank BNL1 may surround each of the light-emitting area EMA and the sub-area SA. Each of the light-emitting area EMA and the sub-area SA may be defined by the first bank BNL1.

The first bank BNL1 may have a certain vertical dimension. In some embodiments, a top face of the first bank BNL1 may have a vertical level higher than a that of a top face of the bank pattern BP. A thickness of the first bank BNL1 may be equal to or greater than that of the bank pattern BP. However, the disclosure is not limited thereto. The top face of the first bank BNL1 may have a vertical level lower or than or equal to that of the top face of the bank pattern BP. A thickness of the first bank BNL1 may be smaller than that of the bank pattern BP. The first bank BNL1 may prevent ink from overflowing to an adjacent sub-pixel SPX1, SPX2, or SPX3 in the inkjet printing process during a manufacturing process of the display device 10. The first bank BNL1 may prevent different inks in which different light-emitting elements ED may be disposed in different sub-pixels SPX1, SPX2, and SPX3 from being mixed with each other. The first bank BNL1 may include polyimide as the bank pattern BP may include. However, the disclosure is not limited thereto.

The light-emitting elements ED may be disposed on the first insulating layer PAS1. A light-emitting element ED may include layers arranged in a direction parallel to a top face of the substrate SUB. The light-emitting element ED of the display device 10 may extend in a direction parallel to the top face of the substrate SUB. Semiconductor layers included in the light-emitting element ED may be sequentially arranged along a direction parallel to the top face of the substrate SUB. However, the disclosure is not limited thereto. In some cases, in case that the light-emitting element ED has a different structure, layers thereof may be arranged in the third direction DR3 perpendicular to the substrate SUB.

The light-emitting elements ED may be spaced apart from each other along the second direction DR2 in which each of the electrodes RME1 and RME2 extend, and may be aligned to be substantially parallel to each other. The light-emitting element ED may have a shape extending in a direction. A direction in which each of the electrodes RME1 and RME2 extends and a direction in which the light-emitting element ED extends may be substantially perpendicular to each other. However, the disclosure is not limited thereto. The light-emitting element ED may extend in an oblique manner to the direction in which each of the electrodes RME1 and RME2 extends.

The light-emitting elements ED arranged in each of the sub-pixels SPX1, SPX2, and SPX3 may respectively include light-emitting layers to emit light of the same wavelength to an outside. Accordingly, light of the same color may be emitted from each of the first sub-pixel SPX1, the second sub-pixel SPX2 and the third sub-pixel SPX3. However, the disclosure is not limited thereto, and each of the sub-pixels SPX1, SPX2, and SPX3 may include different types of light-emitting elements ED to emit light beams of different colors, respectively.

The light-emitting element ED may be disposed between the bank patterns BP while opposing ends of the light-emitting element ED may be disposed on the first and electrodes RME1 and RME2, respectively. An extension length of the light-emitting element ED may be larger than a spacing between the first electrode RME1 and the second electrode RME2, and the opposing ends of the light-emitting element ED may be disposed on the first electrode RME1 and the second electrode RME2, respectively. For example, the light-emitting element ED may be positioned such that an end thereof is disposed on the first electrode RME1 and another end thereof is disposed on the second electrode RME2.

The opposing ends of the light-emitting element ED may contact connective electrodes CNE1 and CNE2 respectively. For example, the insulating film ('38' in FIG. 6) may not be formed on an end face of each of both ends of the light-emitting element ED opposite to each other in the extension direction thereof. Thus, a portion of the semiconductor layer ('31' and '32' in FIG. 6) or a portion of the electrode layer ('37' of FIG. 6) may be exposed. The exposed portion of the semiconductor layer or the electrode layer may be in contact with each of the connective electrodes CNE1 and CNE2. However, the disclosure is not limited thereto. At least a portion of the insulating film may be removed from the light-emitting element ED so that side faces of opposing ends of the semiconductor layer may be partially exposed. Thus, the exposed side faces of the semiconductor layer may be in direct contact with the connective electrodes CNE1 and CNE2, respectively.

The second insulating layer PAS2 may be partially disposed on the light-emitting element ED. For example, the second insulating layer PAS2 may be disposed on the light-emitting element ED and may have a width smaller than an extension length of the light-emitting element ED so that opposing ends of the light-emitting element ED are exposed. The second insulating layer PAS2 may be deposited to cover the light-emitting element ED, the electrodes RME1 and RME2 and the first insulating layer PAS1, and may be patterned to expose the opposing ends of the light-emitting element ED during the manufacturing process of display device 10. The second insulating layer PAS2 may extend in the second direction DR2 and may overlap the first insulating layer PAS1 and the light-emitting element ED in a plan view, and thus may be formed in a linear or island-like pattern within each of the sub-pixels SPX1, SPX2, and SPX3. The second insulating layer PAS2 may protect the light-emitting element ED and at the same time, fix the light-emitting element ED in the manufacturing process of the display device 10.

The connective electrodes CNE1 and CNE2 may be disposed on the first insulating layer PAS1, the second insulating layer PAS2 and the light-emitting element ED.

The connective electrodes CNE1 and CNE2 may be respectively disposed on the electrodes RME1 and RME2. The connective electrodes CNE1 and CNE2 may include the first connective electrode CNE1 disposed on the first electrode RME1 and the second connective electrode CNE2 disposed on the second electrode RME2. The connective electrodes CNE1 and CNE2 may be spaced apart from each other or to face each other. For example, the first connective electrode CNE1 and the second connective electrode CNE2 may be disposed on the first electrode RME1 and the second electrode RME2, respectively, and may be spaced apart from each other in the first direction DR1.

The first connective electrode CNE1 may extend in the second direction DR2 while being disposed in the light-emitting area EMA. The first connective electrode CNE1 may overlap the first electrode RME1 and may extend in the same direction in which the first electrode RME1 extends. The first connective electrode CNE1 may generally have a shape extending in the second direction DR2.

The second connective electrode CNE2 may extend in the second direction DR2 while being disposed in the light-emitting area EMA. The second connective electrode CNE2 may overlap the second electrode RME2 and may extend in the same direction in which the second electrode RME2 extends. The second connective electrode CNE2 may generally have a shape extending in the second direction DR2.

The connective electrodes CNE1 and CNE2 may be in contact with each of the light-emitting elements ED. The first connective electrode CNE1 may contact an end of each of the light-emitting elements ED, and the second connective electrode CNE2 may contact another end of each of the light-emitting elements ED. A light-emitting element ED may be constructed such that the semiconductor layer or the electrode layer thereof may be partially exposed at an end face of each of opposing ends in the extending direction thereof. Each of the connective electrodes CNE1 and CNE2 may come into contact with the exposed portion of the semiconductor layer or the electrode layer of the light-emitting element ED and thus may be electrically connected thereto. Side portions of the connective electrodes CNE1 and CNE2 respectively in contact with opposing ends of the light-emitting element ED may be disposed on opposing side faces of the second insulating layer PAS2. In an embodiment, the first connective electrode CNE1 may be disposed on a side face of the second insulating layer PAS2, while the second connective electrode CNE2 may be disposed on another side face of the second insulating layer PAS2.

Each of the connective electrodes CNE1 and CNE2 may have a width measured in a direction smaller than a width measured in the a direction of each of the electrodes RME1 and RME2. The connective electrodes CNE1 and CNE2 may respectively contact an end and another end of each of the light-emitting elements ED, and may respectively cover portions of top faces of the first electrode RME1 and the second electrode RME2. However, the disclosure is not limited thereto, and each of the connective electrodes CNE1 and CNE2 may have a width greater than that of each of the electrodes RME1 and RME2 and thus may cover opposing side faces of each of the electrodes RME1 and RME2.

Each of the connecting electrodes CNE1 and CNE2 may include a transparent conductive material. For example, the transparent conductive material may include ITO, IZO, ITZO, aluminum (Al), etc., or a combination thereof. The light emitted from the light-emitting element ED may pass through the connective electrodes CNE1 and CNE2 and travel upwards. However, the disclosure is not limited thereto.

Although the drawing shows that two connective electrodes CNE1 and CNE2 are disposed in each of the sub-pixels SPX1, SPX2, and SPX3, the disclosure is not limited thereto. The number of the connective electrodes CNE1 and CNE2 disposed in each of the sub-pixels SPX1, SPX2, and SPX3 may vary according to the number of the electrodes RME1 and RME2 disposed in each of the sub-pixels SPX1, SPX2, and SPX3.

A third insulating layer PAS3 may be disposed on the first connective electrode CNE1. The third insulating layer PAS3 may electrically insulate the first connective electrode CNE1 and the second connective electrode CNE2 from each other. The third insulating layer PAS3 may cover the first connective electrode CNE1, and may not be disposed on another end of the light-emitting element ED so that the light-emitting element ED may contact the second connective electrode CNE2. The third insulating layer PAS3 may partially contact the top face of the second insulating layer PAS2 and may contact the first connective electrode CNE1. A side face of the third insulating layer PAS3 facing the second electrode RME2 may be aligned with a side face of the second insulating layer PAS2. Further, the third insulating layer PAS3 may be disposed on the non-light-emitting area, for example, on a portion of the first insulating layer PAS1 disposed on the via layer VIA. However, the disclosure is not limited thereto.

The second connective electrode CNE2 is disposed on the second electrode RME2, the second insulating layer PAS2 and the third insulating layer PAS3. The second connective electrode CNE2 may contact another end of the light-emitting element ED and an exposed top face of the second electrode RME2. The another end of the light-emitting element ED may be electrically connected to the second electrode RME2 via the second connective electrode CNE2.

The second connective electrode CNE2 may partially contact the second insulating layer PAS2, the third insulating layer PAS3, the second electrode RME2 and the light-emitting element ED. The first connective electrode CNE1 and the second connective electrode CNE2 may not be in contact with each other due to the second insulating layer PAS2 and the third insulating layer PAS3. However, the disclosure is not limited thereto, and in some cases, the third insulating layer PAS3 may be omitted.

The fourth insulating layer PAS4 may be disposed on the third insulating layer PAS3, the second connective electrode CNE2 and the first bank BNL1. The fourth insulating layer PAS4 may be disposed on and cover a top face of each of the third insulating layer PAS3, the second connective electrode CNE2 and the first bank BNL1.

Each of the first insulating layer PAS1, the second insulating layer PAS2, the third insulating layer PAS3, and the fourth insulating layer PAS4 as described above may include an inorganic insulating material or an organic insulating material. In an embodiment, each of the first insulating layer PAS1, the second insulating layer PAS2, the third insulating layer PAS3, and the fourth insulating layer PAS4 may include an inorganic insulating material such as silicon oxide ($SiO_x$), silicon nitride ($SiN_x$), silicon oxynitride ($SiO_xN_y$), aluminum oxide ($AlO_x$), aluminum nitride ($AlN_x$), etc., or a combination thereof. In other embodiments, each of the first insulating layer PAS1, the second insulating layer PAS2, the third insulating layer PAS3, and the fourth insulating layer PAS4 may include an organic insulating material such as acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, polymethyl methacrylate-polycarbonate synthetic resin, etc., or a combination thereof. However, the disclosure is not limited thereto.

The second bank BNL2 may be disposed on the fourth insulating layer PAS4. The second bank BNL2 may be disposed directly on a top face of the fourth insulating layer PAS4, and may overlap the first bank BNL1. The second bank BNL2 may extend in the first direction DR1 and the second direction DR2 and thus may have a grid pattern in a plan view. The second bank BNL2 may be disposed at a boundary between adjacent ones of the sub-pixels SPX1, SPX2, and SPX3 so that neighboring ones of the sub-pixel SPX1, SPX2, and SPX3 may be distinguished from each other via the second bank BNL2. Further, the second bank BNL2 may surround each of the light-emitting area EMA and the sub-area SA.

The second bank BNL2 may have a vertical dimension. The second bank BNL2 may prevent ink from overflowing to an adjacent sub-pixel SPX1, SPX2, or SPX3 in the inkjet printing process during the manufacturing process of the display device 10. The second bank BNL2 may prevent different inks in which components of different wavelength control layers CWL in different sub-pixels SPX1, SPX2, and SPX3 are dispersed from mixing with each other. The second bank BNL2 may include polyimide as the first bank BNL1 may include. However, the disclosure is not limited thereto.

The wavelength control layer CWL may be disposed on the light-emitting element layer EL. According to an embodiment, the wavelength control layer CWL may be disposed in an area surrounded with the first bank BNL1 and the second bank BNL2. The wavelength control layer CWL may be present in each of the sub-pixels SPX1, SPX2, and SPX3, and may be present in the light-emitting area EMA but may be absent in the sub-area SA in the area surrounded with the first bank BNL1 and the second bank BNL2. The wavelength control layer CWL may be disposed in an area surrounded with the first bank BNL1 in an area in which the light-emitting element ED of the light-emitting element layer EL may be disposed.

In some embodiments, a vertical level of a top of the wavelength control layer CWL may be higher than a vertical level of a top of the second bank BNL2. The wavelength control layer CWL may be formed through an inkjet printing process or a photo process during the manufacturing process of the display device 10. The wavelength control layer CWL may be formed by spraying or applying a material constituting the wavelength control layer CWL onto the area surrounded with the second bank BNL2 and performing drying or exposure and development processes thereon. In an example, the material constituting the wavelength control layer CWL may include an organic material and thus may have viscosity. Even in case that the organic material is sprayed or applied to a level higher than a level of a top of the second bank BNL2, the material may not flow over the second bank BNL2 into an adjacent sub-pixel SPX1, SPX2, or SPX3. Accordingly, the vertical level of the top of the wavelength control layer CWL may be higher than that of the second bank BNL2. However, the disclosure is not limited thereto.

In an embodiment in which the light-emitting element layer EL of each of the sub-pixels SPX1, SPX2, and SPX3 emits light of the third color as a blue color, the wavelength control layer CWL may include a first wavelength conversion layer WCL1 disposed in the first sub-pixel SPX1, a second wavelength conversion layer WCL2 disposed in the second sub-pixel SPX2, and a transmissive layer TPL disposed in the third sub-pixel SPX3.

The first wavelength conversion layer WCL1 may include a first base resin BRS1 and a first wavelength conversion material WCP1 received in the first base resin BRS1. The second wavelength conversion layer WCL2 may include a second base resin BRS2 and a second wavelength conversion material WCP2 received in the second base resin BRS2. Each of the first wavelength conversion layer WCL1 and the second wavelength conversion layer WCL2 may convert a wavelength of the third color light incident thereto from the light-emitting element layer EL and may output light having the converted wavelength. A light-scatter SCP of each of the first wavelength conversion layer WCL1 and the second wavelength conversion layer WCL2 may increase the wavelength conversion efficiency.

The transmissive layer TPL may include a third base resin BRS3 and a light-scatter SCP received in the third base resin BRS3. The transmissive layer TPL transmits the light of the third color incident thereto from the light-emitting element layer EL while maintaining the wavelength thereof. The light-scatter SCP of the transmissive layer TPL may play a role in controlling a travel path of light through the transmissive layer TPL. The transmissive layer TPL may be free of a wavelength converting material.

The light-scatter SCP may have a refractive index different from those of the first to third base resins BRS1, BRS2, and BRS3. The light-scatter SCP may be embodied as metal oxide particles or organic particles. Examples of the metal oxide particle may include titanium oxide ($TiO_2$), zirconium oxide ($ZrO_2$), aluminum oxide ($Al_2O_3$), indium oxide ($In_2O_3$), zinc oxide ($ZnO_2$), silica, barium sulfate ($BaSO_4$), and/or tin oxide ($SnO_2$). Examples of the organic particle may include polystyrene, or polymethyl methacrylate (PMMA). The light-scatter SCP may be hollow. The disclosure is not limited thereto.

A size of the light-scatter SCP may be related to a wavelength of the light emitted from the light-emitting element ED. For example, the size of the light-scatter SCP may be in a range of $\lambda/10$ to $5\lambda$, in an embodiment $\lambda/2$ in case that the wavelength of light emitted from the light-emitting element ED is $\lambda$. However, the disclosure is limited thereto. For example, in case that the light emitted from the light-emitting element ED has a peak wavelength in a range of 480 nm or smaller, in an embodiment 445 nm to 480 nm, the size of the light-scatter SCP may be in a range of 150 nm to 300 nm.

Each of the first to third base resins BRS1, BRS2, and BRS3 may include a light-transmissive organic material. For example, each of the first to third base resins BRS1, BRS2, and BRS3 may include epoxy-based resin, acrylic-based resin, cardo-based resin, and/or imide-based resin. The first to third base resins BRS1, BRS2, and BRS3 may be made of the same material. However, the disclosure is not limited thereto.

The first wavelength conversion material WCP1 may convert light of the third color into light of the first color, and the second wavelength conversion material WCP2 may convert light of the third color into light of the second color. Each of the first wavelength conversion material WCP1 and the second wavelength conversion material WCP2 may include quantum dots, quantum rods, phosphors, and the like, or a combination thereof.

For example, the first wavelength conversion material WCP1 may be a material that converts blue light into red light. Further, the second wavelength conversion material WCP2 may be a material that converts blue light into green light. Each of the first wavelength conversion material WCP1 and the second wavelength conversion material WCP2 may include quantum dots (QD), quantum rods, a fluorescent material or a phosphorescent material. The quantum dot may include a group IV nanocrystal, a group II-VI compound nanocrystal, a group III-V compound nanocrystal, a group IV-VI nanocrystal, or a combination thereof.

The quantum dot may include a core and a shell surrounding the core. For example, the core may include at least one of CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, and Ge. However, the disclosure is not limited thereto. For example, the core may include at least one of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe and PbTe.

The fluorescent material may include an inorganic fluorescent material. The inorganic fluorescent material may include garnet, silicates, sulfides, oxynitrides, nitrides, aluminates, or a combination thereof. The inorganic fluorescent material may include at least one of $Y_3Al_5O_{12}:Ce^{3+}$ (YAG:Ce), $Tb_3A_{15}O_{12}:Ce^{3+}$ (TAG:Ce), $(Sr,Ba,Ca)_2SiO_4:Eu^{2+}$, $(Sr,Ba,Ca,Mg,Zn)_2Si(OD)_4:Eu^{2+}$ D=F,Cl,S,N,Br, $Ba_2MgSi_2O_7:Eu^{2+}$, $Ba_2SiO_4:Eu^{2+}$, $Ca_3(Sc,Mg)_2Si_3O_{12}:Ce^{3+}$, $(Ca,Sr)S:Eu^{2+}$, $(Sr,Ca)Ga_2S_4:Eu^{2+}$, $SrSi_2O_2N_2:Eu^{2+}$, $SiAlON:Ce^{3+}$, $\beta\text{-}SiAlON:Eu^{2+}$, $Ca\text{-}\alpha\text{-}SiAlON:Eu^{2+}$, $Ba_3Si_6O_{12}N_2:Eu^{2+}$, $CaAlSiN_3:Eu^{2+}$, $(Sr,Ca)AlSiN_3:Eu^{2+}$, $Sr_2Si_5N_8:Eu^{2+}$, $(Sr,Ba)Al_2O_4:Eu^{2+}$, $(Mg,Sr)Al_2O_4:Eu^{2+}$, $BaMg_2Al_{16}O_{27}:Eu^{2+}$. However, the disclosure is not limited thereto, and the fluorescent material may include an organic fluorescent material.

The wavelength control layer CWL may be disposed directly on the light-emitting element layer EL. In the display device 10, the second bank BNL2 may have a vertical dimension and may surround each of the sub-pixels SPX1, SPX2, and SPX3. Thus, the base resins BRS1, BRS2, and BRS3 of the wavelength control layer CWL may be disposed directly on the fourth insulating layer PAS4 of the light-emitting element layer EL.

Each of the base resins BRS1, BRS2, and BRS3 of the wavelength control layer CWL may cover the light-emitting elements ED, the bank patterns BP, the electrodes RME and the connective electrodes CNE1 and CNE2 of the light-emitting element layer EL while being disposed in the area defined by the second bank BNL2. Further, the light-scatters SCP and the wavelength conversion materials WCP1 and WCP2 of the wavelength control layer CWL may be respectively disposed in the base resins BRS1, BRS2, and BRS3, and may be located adjacent to the light-emitting element layer EL.

Light beams emitted from each light-emitting element layer EL may have the same third color. Light beams emitted from the light-emitting element layer EL may travel toward the wavelength control layer CWL. The third color light emitted from the light-emitting element ED disposed in the first sub-pixel SPX1 may be incident on the first wavelength conversion layer WCL1, light of the third color emitted from the light-emitting element ED disposed in the second sub-pixel SPX2 may be incident on the second wavelength conversion layer WCL2, and the third color light emitted from the light-emitting element ED disposed in the third sub-pixel SPX3 may be incident on the transmissive layer TPL. The third color light incident on the first wavelength conversion layer WCL1 may be converted into the first color light, and the third color light incident on the second wavelength conversion layer WCL2 may be converted into the second color light. The light incident on the transmissive layer TPL may transmit through the transmissive layer TPL while a wavelength thereof may be maintained. Although the sub-pixels SPX1, SPX2, and SPX3 respectively include the light-emitting element layers EL that emit light of the same color, the sub-pixels SPX1, SPX2, and SPX3 may respectively emit light beams of different colors based on a configuration of the wavelength control layer CWL disposed on the light-emitting element layer EL.

In an example, the protective layer PRL may be disposed on the wavelength control layer CWL. The protective layer PRL may protect an underlying structure including the wavelength control layer CWL and may planarize a step. The protective layer PRL may include a first capping layer CPL1, a low refractive layer LR and a second capping layer CPL2.

The first capping layer CPL1 may be disposed on the wavelength control layer CWL. The first capping layer CPL1 may be disposed on the second bank BNL2 and wavelength control layer CWL so as to cover the second bank BNL2 and the wavelength control layer CWL. The first capping layer CPL1 may be disposed over an entirety of the display area ('DPA' of FIG. 1) of the display device 10.

The first capping layer CPL1 may include an inorganic material. For example, the first capping layer CPL1 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The drawing shows that the first capping layer CPL1 is embodied as one layer.

However, the disclosure is not limited thereto. For example, the first capping layer CPL1 may be embodied as a multilayer in which inorganic layers including at least one of the materials disclosed above as a material of the first capping layer CPL1 may be alternately stacked on each other. A thickness of the first capping layer CPL1 may be in a range from 0.05 μm to 2 μm. However, the disclosure is not limited thereto.

The low refractive layer LR may be disposed on the first capping layer CPL1. The low refractive layer LR may be interposed between the first capping layer CPL1 and the second capping layer CPL2. The low refractive layer LR may be disposed over an entirety of the display area ('DPA' of FIG. 1) of the display device 10. The low refractive layer LR may be interposed between the wavelength control layer CWL and the color filter layer CFL, and may serve to planarize a step resulting from the wavelength control layer CWL. Further, the low refractive layer LR may be a low refractive index layer that reduces reflectance of light.

A refractive index of the low refractive layer LR may be in a relatively low range compared to that of each of the first capping layer CPL1 and the second capping layer CPL2 constituting the protective layer PRL. For example, the refractive index of the low refractive layer LR may be in a range of 1.2 to 1.5. However, the disclosure is not limited thereto.

The low refractive layer LR may include an organic material. For example, the low refractive layer LR may include at least one of acryl resin, epoxy resin, phenolic resin, polyamide resin, and polyimide resin. A thickness of the low refractive layer LR may be in a range of 0.2 μm to 10 μm. However, the disclosure is not limited thereto. The low refractive layer LR may further include particles for lowering the refractive index thereof.

The second capping layer CPL2 may be disposed on the low refractive layer LR. The second capping layer CPL2 may be interposed between the low refractive layer LR and the color filter layer CFL. The second capping layer CPL2 may have substantially the same configuration as that of the above-described first capping layer CPL1. Thus, a description thereof will be omitted.

The color filter layer CFL may be disposed on the protective layer PRL and in the display area ('DPA' of FIG. 1). Specifically, the color filter layer CFL may be disposed on the second capping layer CPL2 of the protective layer PRL. The color filter layer CFL may include color filters CF.

The color filter layer CFL may include a first color filter CF1, a second color filter CF2 and a third color filter CF3.

The first color filter CF1 may be disposed to overlap the light-emitting area EMA of the first sub-pixel SPX1. The second color filter CF2 may be disposed to overlap the light-emitting area EMA of the second sub-pixel SPX2, and the third color filter CF3 may be disposed to overlap the light-emitting area EMA of the third sub-pixel SPX3. Further, in the non-light-emitting area NEA of each of the sub-pixels SPX1, SPX2, and SPX3, the first color filter CF1, the second color filter CF2 and the third color filter CF3 may be stacked on each other in the third direction DR3.

Each of the first to third color filters CF1, CF2, CF3 may include a colorant such as dye or pigment that absorbs a wavelength other than a wavelength of a corresponding color. The first color filter CF1 may selectively transmit light of the first color (e.g., red light) therethrough, and may block or absorb light of the second color (e.g., green light) and the third color (e.g., blue light). The second color filter CF2 may selectively transmit light of the second color (e.g., green light) therethrough and may block or absorb light of the first color (e.g., red light) and the third color (e.g., blue light). The third color filter CF3 may selectively transmit light of the third color (e.g., blue light) therethrough, and may block or absorb light of the first color (e.g., red light) and the second color (e.g., green light). For example, the first color filter CF1 may be a red color filter, the second color filter CF2 may be a green color filter, and the third color filter CF3 may be a blue color filter.

In an embodiment, the light incident on the first color filter CF1 may be the light of the first color into which the first wavelength conversion layer WCL1 has converted the light of the third color. The light incident on the second color filter CF2 may be the light of the second color into which the second wavelength conversion layer WCL2 has converted the light of the third color. The light incident on the third color filter CF3 may be the light of the third color passing through the transmissive layer TPL. As a result, the light of the first color passing through the first color filter CF1, the light of the second color passing through the second color filter CF2, and the light of the third color passing through the third color filter CF3 may be emitted upwardly of the substrate SUB to render a full color.

The first to third color filters CF1, CF2, and CF3 may absorb a portion of light introduced from the outside of the display device 10 to reduce reflected light due to external light. Accordingly, the first to third color filters CF1, CF2, and CF3 may prevent color distortion due to reflection of external light.

In the non-light-emitting area NEA of each of the sub-pixels SPX1, SPX2, and SPX3, all of light of the first color, light of the second color, and light of the third color may be blocked or absorbed. For example, light of the first color incident on the non-light-emitting area NEA of the first sub-pixel SPX1 may pass through the first color filter CF1, but may be blocked and absorbed by the second color filter CF2 and the third color filter CF3 disposed on the first color filter CF1. The second color light incident on the non-light-emitting area NEA of the second sub-pixel SPX2 may pass through the second color filter CF2, but may be blocked and absorbed by the first color filter CF1 and the third color filter CF3 disposed on the second color filter CF2. The third color light incident on the non-light-emitting area NEA of the third sub-pixel SPX3 may pass through the third color filter CF3, but may be blocked and absorbed by the first color filter CF1 and the second color filter CF2 disposed on the third color filter CF3.

As described above, the non-light-emitting area NEA of each of the sub-pixels SPX1, SPX2, and SPX3 may function to not only block light emission but also suppress external light reflection. The non-light-emitting area NEA of each of the sub-pixels SPX1, SPX2, and SPX3 may surround the light-emitting area EMA in a plan view. Thus, the non-light-emitting area NEA may be formed in a grid pattern in a plan view. In some embodiments, the non-light-emitting area NEA of each of the sub-pixels SPX1, SPX2, and SPX3 may be formed to have a width smaller than that of the first bank BNL1. However, the disclosure is not limited thereto, and the non-light-emitting area NEA of each of the sub-pixels SPX1, SPX2, and SPX3 may be formed to have substantially the same width as that of the first bank BNL1.

In some embodiments, sizes of the light-emitting areas EMA of the sub-pixels SPX1, SPX2, and SPX3 may be different from each other. For example, the first color filter CF1 including a red color material may be disposed in the first sub-pixel SPX1, and an area of the first sub-pixel SPX1 may be larger than that of each of the second sub-pixel SPX2 and the third sub-pixel SPX3. Further, the second color filter CF2 including a green color material may be disposed in the second sub-pixel SPX2 and an area of the second sub-pixel SPX2 may be larger than that of the third sub-pixel SPX3. However, the disclosure is not limited thereto. At least one of the sub-pixels SPX1, SPX2, and SPX3 may have an area different from those of the rest of the sub-pixels SPX1, SPX2, and SPX3. The area size relationship may be different from that described above. In case that the sub-pixels SPX1, SPX2, and SPX3 have different areas, the display device 10 may prevent display quality degradation due to external light reflection.

The color filter layer CFL may be disposed in the light-emitting area EMA in each of the sub-pixels SPX1, SPX2, and SPX3. In the drawings, it is disclosed that the color filter layer CFL is disposed in each of the sub-pixels SPX1, SPX2, and SPX3 to form an island-like pattern. However, the disclosure is not limited thereto.

An overcoat layer OC may be disposed on the color filter layer CFL. The overcoat layer OC may be disposed over an entirety of the display area DPA, and a portion thereof may also be disposed in the non-display area NDA. The overcoat layer OC may include an organic insulating material to protect the elements arranged in the display area DPA from the outside.

The light-emitting element ED included in the above-described light-emitting element layer EL may have a structure as shown in FIG. 6.

Referring to FIG. 6, the light-emitting element ED may be a particle-type element and may have a rod or cylindrical shape with an aspect ratio. The light-emitting element ED may have a size of on a nano-meter scale (1 nm to 1 μm) to a micro-meter scale (1 μm to 1 mm). In an embodiment, the light-emitting element ED may have a diameter and a length of a size of a nanometer scale or a micrometer scale. In some other embodiments, the diameter of the light-emitting element ED may have a size of a nanometer scale, whereas the length of the light-emitting element ED may have a size of a micrometer scale. In some embodiments, each of some light-emitting elements ED may have a diameter and/or a length of a size of a nanometer scale, while each of the other light-emitting elements ED may have a diameter and/or a length of a size of a micrometer scale.

In an embodiment, the light-emitting element ED may be embodied as an inorganic light-emitting diode. Specifically, the light-emitting element ED may include a semiconductor layer doped with impurities of any conductivity type (e.g., a p-type or n-type). The semiconductor layer may receive an electric signal applied from an external power source and emit light of a specific wavelength based on the electric signal.

The light-emitting element ED according to an embodiment may include the first semiconductor layer 31, a light-emitting layer 33, a second semiconductor layer 32, and an electrode layer 37 sequentially stacked on each other in a length direction thereof. The light-emitting element may further include an insulating film 38 surrounding outer faces of the first semiconductor layer 31, the second semiconductor layer 32, and the light-emitting layer 33.

The first semiconductor layer 31 may be an n-type semiconductor. The first semiconductor layer 31 may include a semiconductor material having a chemical formula of $Al_x$-$Ga_yIn_{1-x-y}N$ ($0 \leq x \leq 1$, $0 \leq y \leq 1$, $0 \leq x+y \leq 1$). For example, the first semiconductor layer 31 may be made of at least one of AlGaInN, GaN, AlGaN, InGaN, AlN, and InN and may be doped with a n-type dopant. The n-type dopant doped into the first semiconductor layer 31 may be Si, Ge, Sn, Se, or the like. For example, the first semiconductor layer 31 may be made of n-GaN doped with n-type Si. A length of the first semiconductor layer 31 may range from 1.5 μm to 5 μm. However, the disclosure is not limited thereto.

The second semiconductor layer 32 may be disposed on the light-emitting layer 33 to be described later. The second semiconductor layer 32 may be a p-type semiconductor. In case that the light-emitting element ED emits light in a blue or green wavelength band, the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be made of at least one of AlGaInN, GaN, AlGaN, InGaN, AlN, and InN and may be doped with a p-type dopant. The p-type dopant doped into the second semiconductor layer 32 may be Mg, Zn, Ca, Ba, or the like. For example, the second semiconductor layer 32 may be made of p-GaN doped with p-type Mg. A length of the second semiconductor layer 32 may range from 0.05 μm to 0.10 μm. However, the disclosure is not limited thereto.

In an example, the drawing shows that each of the first semiconductor layer 31 and the second semiconductor layer 32 is composed of a single layer. However, the disclosure is not limited thereto. Depending on a material of the light-emitting layer 33, each of the first semiconductor layer 31 and the second semiconductor layer 32 may further include a larger number of layers, for example, a cladding layer or a TSBR (tensile strain barrier reducing) layer.

The light-emitting layer 33 may be disposed between the first semiconductor layer 31 and the second semiconductor layer 32. The light-emitting layer 33 may include a material of a single or multiple quantum well structure. In case that the light-emitting layer 33 includes the material of the multiple quantum well structure, the light-emitting layer 33 may have a structure in which quantum layers and well layers are alternately stacked with each other. The light-emitting layer 33 may emit light via combinations between electrons and holes according to an electrical signal applied through the first semiconductor layer 31 and the second semiconductor layer 32. The light-emitting layer 33 may include a material such as AlGaN and AlGaInN. In particular, in case that the light-emitting layer 33 has a structure in which a quantum layers and well layers are alternately stacked with each other, the quantum layer may include a material such as AlGaN or AlGaInN, and the well layer may include a material such as GaN or AlInN. For example, the light-emitting layer 33 may include AlGaInN as the quantum layer and AlInN as the well layer, such that the light-emitting layer 33 emits blue light with a central wavelength band ranging from 450 nm to 495 nm, as described above.

However, the disclosure is not limited thereto. The light-emitting layer 33 may have a structure in which multiple first layers made of a semiconductor material having a larger bandgap energy and multiple second layers made of a semiconductor material having a smaller bandgap energy may be alternately stacked with each other. The light-emitting layer 33 may include group III to group V semiconductor materials depending on a wavelength band of emitting light. The light emitting from the light-emitting layer 33 is not limited to light of a wavelength band corresponding to a blue color. In some cases, the light emitting from the light-emitting layer 33 may be light of a wavelength band corresponding to a red or green color. A length of the light-emitting layer 33 may be in a range of 0.05 μm to 0.10 μm. However, the disclosure is not limited thereto.

In an example, light emitted from the light-emitting layer 33 may travel not only toward a length directional outer face of the light-emitting element ED, but also toward both side opposite ends. A directionality in which the light emitted from the light-emitting layer 33 travels is not limited to one direction.

The electrode layer 37 may be embodied as an ohmic connection electrode. The disclosure is not limited thereto. The electrode layer 37 may be embodied as a Schottky connection electrode. The light-emitting element ED may include at least one electrode layer 37. FIG. 6 shows that the light-emitting element ED includes one electrode layer 37. However, the disclosure is not limited thereto. In some cases, the light-emitting element ED may include a larger number of electrode layers 37 or the electrode layer 37 may be omitted. Descriptions of the light-emitting element ED which will be made later may be equally applied to a case even in case that the number of the electrode layers 37 varies or other structures are further included therein.

The electrode layer 37 may reduce an electrical resistance between the light-emitting element ED and the electrode or the connection electrode in case that the light-emitting element ED is electrically connected to the electrode or the connection electrode in the display device 10. The electrode layer 37 may include a conductive metal. For example, the electrode layer 37 may include at least one of aluminum (Al), titanium (Ti), indium (In), gold (Au), silver (Ag), ITO (Indium Tin Oxide), IZO (Indium Zinc Oxide) and ITZO (Indium Tin-Zinc Oxide). The electrode layer 37 may include a semiconductor material doped with n-type or p-type dopant. The electrode layer 37 may include the same material, or different material. However, the disclosure is not limited thereto.

The insulating film 38 may be disposed to surround an outer face of each of the semiconductor layers and the electrode layer as described above. For example, the insulating film 38 may be disposed to surround at least an outer face of the light-emitting layer 36. The insulating film 38 may extend in a direction in which the light-emitting element ED extends. The insulating film 38 may perform a function of protecting the members. The insulating film 38 may surround the side faces of the members such that opposing ends in a longitudinal direction of the light-emitting element ED may be exposed.

The drawing shows that the insulating film 38 extends in the length direction of the light-emitting element ED so as to cover the side faces of the first semiconductor layer 31 to the electrode layer 37. However, the disclosure is not limited thereto. The insulating film 38 may cover only an outer face of a portion of the semiconductor layer including the light-emitting layer 33, or cover only a portion of the outer face of the electrode layer 37 so that the outer face of the electrode layer 37 is partially exposed. Further, the insulating film 38 may be formed in an area adjacent to at least an end of the light-emitting element ED so as to have a rounded top face in a cross-sectional view.

A thickness of the insulating film 38 may range from 10 nm to 1.0 μm. However, the disclosure is not limited thereto. In an embodiment, the thickness of the insulating film 38 may be about 40 nm.

The insulating film 38 may include a material having insulating ability, for example, silicon oxide ($SiO_x$), silicon nitride ($SiN_x$), silicon oxynitride ($SiO_xN_y$), aluminum nitride ($AlN_x$), aluminum oxide ($AlO_x$), and the like. Thus, the insulating film 38 may prevent an electrical short circuit that may occur in case that the light-emitting layer 33 is in direct contact with an electrode through which an electrical signal may be transmitted to the light-emitting element ED. Further, the insulating film 38 may protect the outer face of the light-emitting element ED including the light-emitting layer 33 such that decrease in light-emitting efficiency may be prevented.

Further, an outer face of the insulating film 38 may be surface-treated. The light-emitting elements ED may be sprayed onto the electrode while being dispersed in ink and may be aligned with each other. In this connection, in order to prevent adjacent light-emitting elements ED from being agglomerated with each other and rather, keep the light-emitting elements ED in a dispersed state in the ink, a surface of the insulating film 38 may be treated to have hydrophobicity or hydrophilicity. For example, an outer face of the insulating film 38 may be surface-treated with a material such as stearic acid, 2,3-naphthalene dicarboxylic acid.

Figure 7:
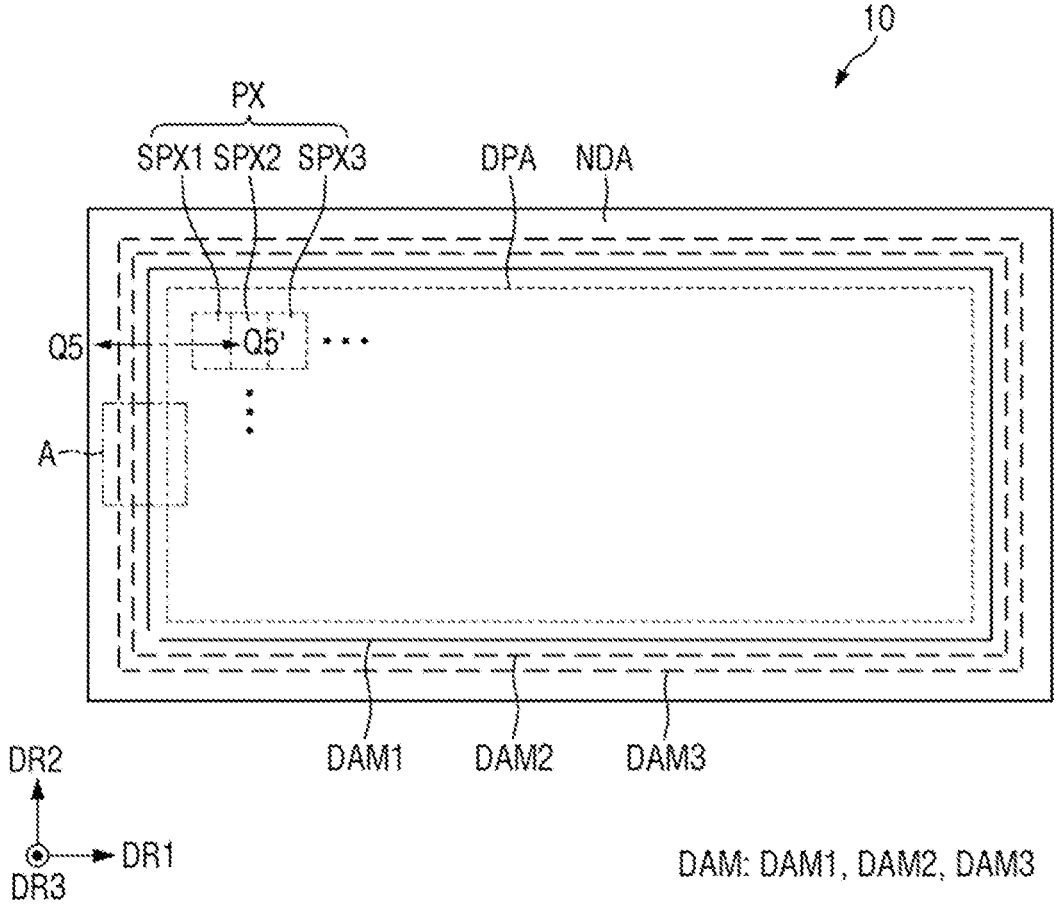
FIG. 7 is a plan view schematically showing a display area and dams disposed in a non-display area of a display device according to an embodiment.
Figure 8:
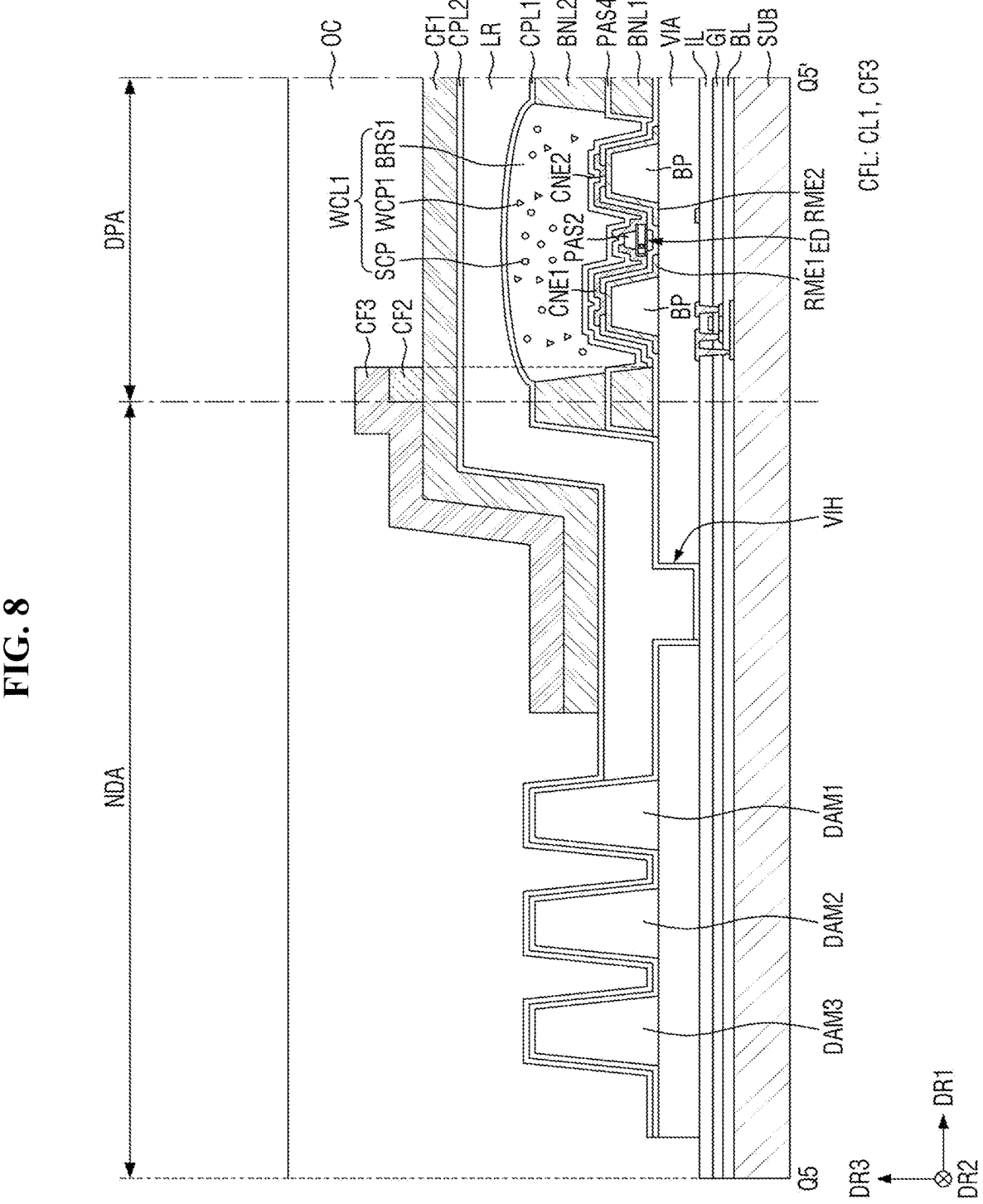
FIG. 8 is a schematic cross-sectional view taken along line Q5-Q5' in FIG. 7.
Figure 9:
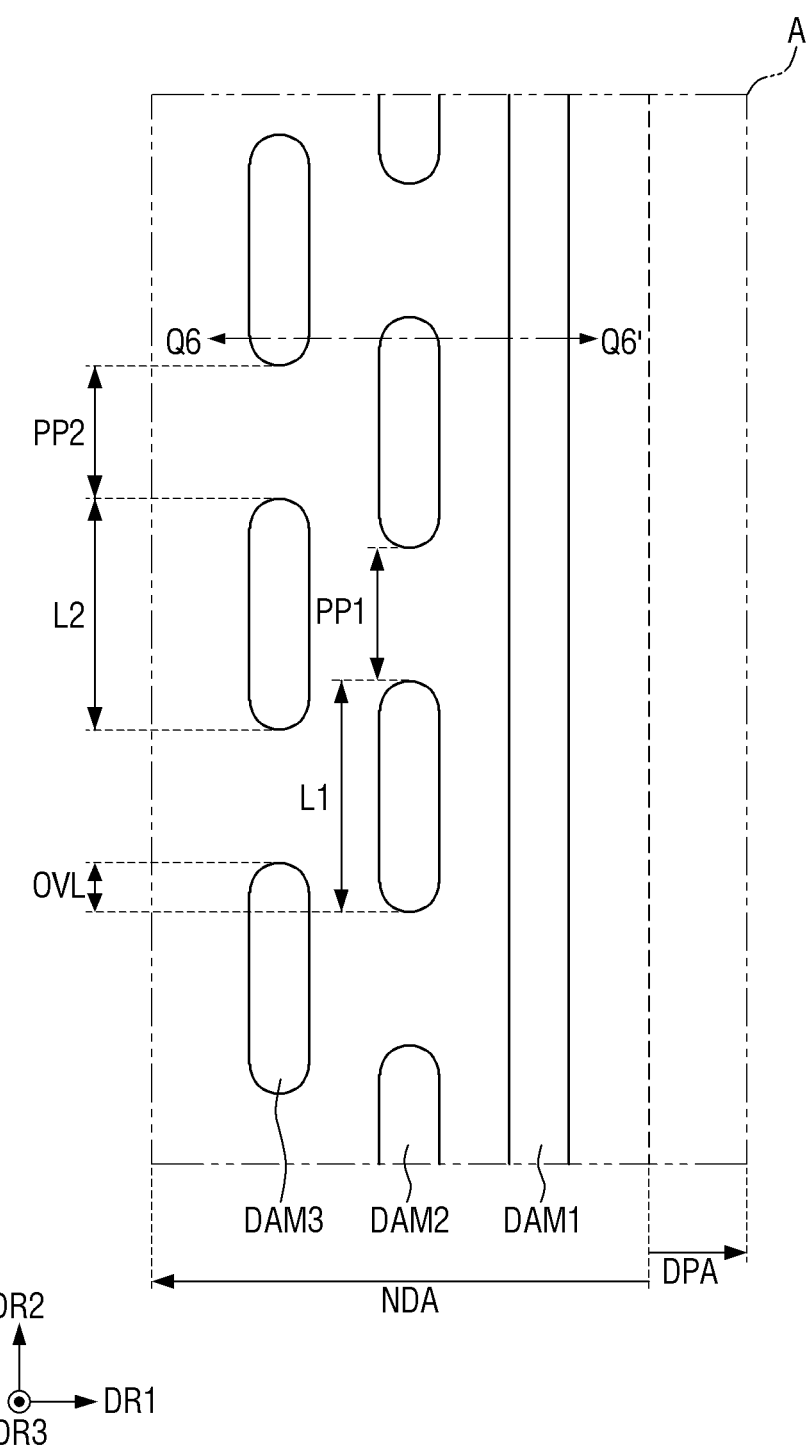
FIG. 9 is an enlarged schematic plan view of area A of FIG. 7.
Figure 10:
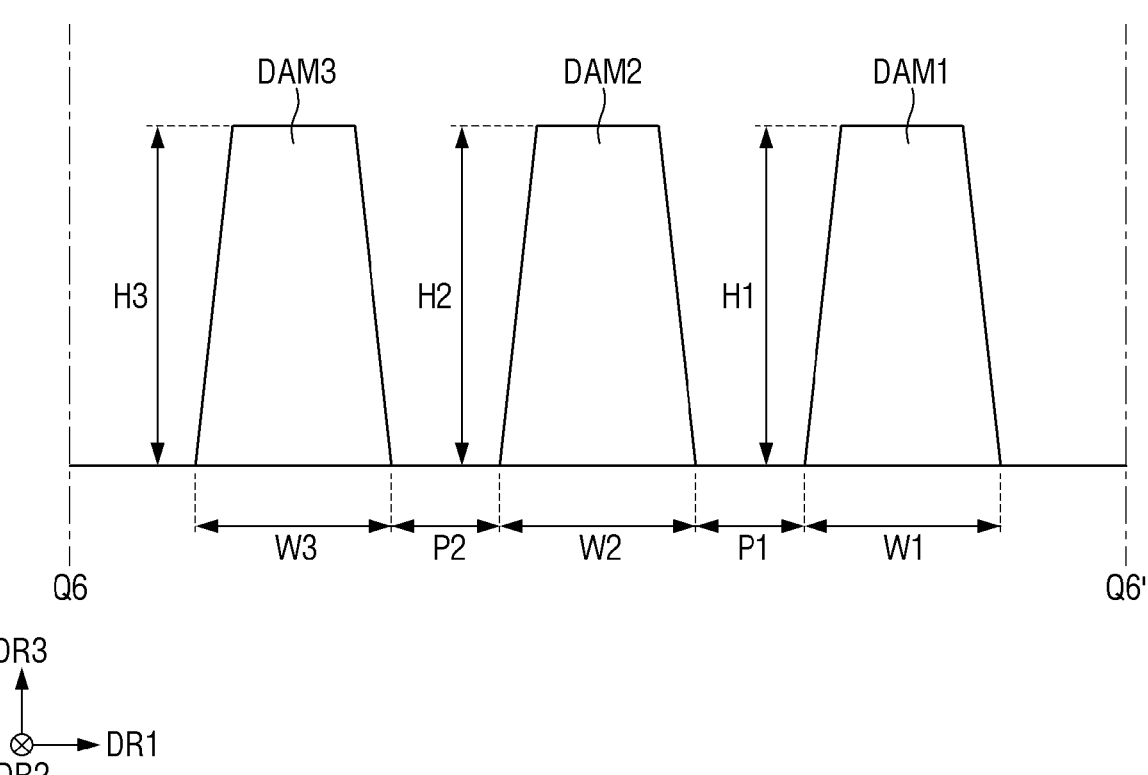
FIG. 10 is a schematic cross-sectional view taken along line Q6-Q6' in FIG. 9.

FIG. 7 is a plan view schematically showing a display area and dams disposed in a non-display area of a display device according to an embodiment. FIG. 8 is a schematic cross-sectional view taken along line Q5-Q5' in FIG. 7. FIG. 9 is an enlarged schematic plan view of area A of FIG. 7. FIG. 10 is a schematic cross-sectional view taken along line Q6-Q6' in FIG. 9.

FIG. 7 shows multiple dams DAM1, DAM2, and DAM3 disposed in the non-display area NDA of the display device 10. FIG. 8 shows a cross-section of one sub-pixel SPX1 of the display area DPA of the display device 10 and the dams DAM1, DAM2, and DAM3 disposed in the non-display area NDA as cut in the first direction DR1. FIG. 9 shows the dams DAM1, DAM2, and DAM3 disposed at a left outer portion of the display device 10. FIG. 10 schematically shows cross-sectional shapes of the dams DAM1, DAM2, and DAM3. Descriptions of a cross-sectional structure of the first sub-pixel SPX1 may be the same as those as described above with reference to FIG. 4 and FIG. 5.

Referring to FIG. 7 to FIG. 10, the display device 10 according to an embodiment may include the dams DAM1, DAM2, and DAM3 disposed in the non-display area NDA. Each of the dams DAM1, DAM2, and DAM3 may be disposed to surround the display area DPA.

The dams DAM1, DAM2, and DAM3 may include the first dam DAM1, the second dams DAM2 and the third dams DAM3.

The first dam DAM1 may be disposed to surround the display area DPA. The first dam DAM1 may be disposed in the non-display area NDA and may be spaced, by a spacing, from the display area DPA. The first dam DAM1 may extend continuously, and may continuously surround the display area DPA. In an embodiment, the first dam DAM1 may have a closed loop shape in a plan view. The first dam DAM1 may extend continuously to prevent an organic material of the low refractive layer LR extending from the display area DPA from overflowing to an outer portion of the substrate SUB.

The second dams DAM2 may be arranged to surround the display area DPA and the first dam DAM1. The second dams DAM2 may be spaced apart from the display area DPA by a larger spacing than the first dam DAM1 may be, and may be disposed in the non-display area NDA. The second dams DAM2 may include island (isolated) patterns. The island patterns may be spaced apart from each other. In an embodiment, the second dams DAM2 may be indicated by a dotted line in a plan view. The second dams DAM2 may further prevent the above-mentioned organic material from overflowing to the outer portion of the substrate SUB.

The third dams DAM3 may be arranged to surround the display area DPA, the first dam DAM1 and the second dams DAM2. The third dams DAM3 may be spaced from the display area DPA by a larger spacing than the second dams DAM2 may be and may be disposed in the non-display area NDA. The third dams DAM3 may include island patterns, and the island patterns may be spaced apart from each other. In an embodiment, the third dams DAM3 may be indicated by a dotted line in a plan view. The third dams, DAM3 may further prevent the above-mentioned organic material from overflowing to the outer portion of the substrate SUB.

As shown in FIG. 8, the first dam DAM1, the second dams DAM2 and the third dams DAM3 as above-described may be disposed in the non-display area NDA, and may be disposed on the same layer. For example, the first dam DAM1, the second dams DAM2 and the third dams DAM3 may be directly disposed on the via layer VIA.

In an embodiment, the via layer VIA may include a groove VIH exposing a portion of the underlying interlayer insulating layer IL. The groove VIH may extend so as to surround the display area DPA to isolate an inner portion of the via layer VIA made of the organic layer from an outer portion thereof. For example, the groove VIH may have a closed loop shape in a plan view. The first capping layer CPL1 disposed on the via layer VIA may extend on and along the groove VIH and thus may directly contact the interlayer insulating layer IL. The first capping layer CPL1 may extend on and along the groove VIH and thus cover the side face of the via layer VIA, thereby preventing the via layer VIA from acting as a path along which moisture invades.

The first capping layer CPL1 may extend from the display area DPA to the non-display area NDA, and may be disposed to cover the first dam DAM1, the second dams DAM2 and the third dams DAM3. Further, the second capping layer CPL2 may cover portions of the first capping layer CPL1 which cover the first dam DAM1, the second dams DAM2 and the third dams DAM3.

The low refractive layer LR may be made of an organic material and may be disposed over an entirety of the display area DPA. In a process of applying the organic material on the first capping layer CPL1, the organic material may be applied to the display area DPA and may flow to the non-display area NDA. In particular, the display device 10 includes one substrate SUB. Layers may be formed thereon via successive processes. In these processes, the organic material overflowing to an unwanted area of the non-display area NDA may remain as a foreign material in a subsequent process. The display device 10 according to an embodiment includes the first dam DAM1, the second dams DAM2 and the third dams DAM3 disposed in the non-display area NDA, thereby preventing the organic material from spreading to the unwanted area.

In an embodiment, the first dam DAM1, the second dams DAM2 and the third dams DAM3 may have the same stacked structure. In an embodiment, each of the first dam DAM1, the second dams DAM2 and the third dams DAM3 may have a single-layer structure. The first dam DAM1, the second dams DAM2 and the third dams DAM3 may include the same material as that of the second bank BNL2 of the display area DPA. A vertical level of a top face of each of the first dam DAM1, the second dams DAM2 and the third dams DAM3 may be the same as a vertical level of a top face of the second bank BNL2. In an embodiment, the first dam DAM1, the second dams DAM2 and the third dams DAM3, and the second bank BNL2 may be formed simultaneously in the same process.

As shown in FIG. 9 and FIG. 10, each of the first dam DAM1, the second dams DAM2 and the third dams DAM3 may be formed to have a width and a vertical dimension. In an embodiment, a width W1 of the first dam DAM1 may be in a range of 1 to 60 μm. A width W2 of each of the second dams DAM2 may be in a range of 1 to 60 μm, and A width W3 of each of the third dams DAM3 may be in a range of 1 to 60 μm. The widths W1, W2, and W3 of the first dam DAM1, each of the second dams DAM2 and each of the third dams DAM3 may be identical to each other. However, the disclosure is not limited thereto, and the widths W1, W2, and W3 of the first dam DAM1, each of the second dams DAM2 and each of the third dams DAM3 may be different from each other. In an embodiment, the width W1 of the first dam DAM1 may be the largest and the width W3 of each of the third dams DAM3 may be the smallest. Conversely, the width W1 of the first dam DAM1 may be the smallest and the width W3 of each of the third dams DAM3 may be the largest.

Further, in an embodiment, a vertical dimension H1 of the first dam DAM1 may be in a range of 5 to 15 μm. A vertical dimension H2 of the second dams DAM2 may be in a range of 5 to 15 μm, and a vertical dimension H3 of the third dams DAM3 may be in a range of 5 to 15 μm. The vertical dimensions H1, H2, and H3 of the first dam DAM1, each of the second dams DAM2 and each of the third dams DAM3 may be identical to each other. However, the disclosure is not limited thereto, and the vertical dimensions H1, H2, and H3 of the first dam DAM1, each of the second dams DAM2 and each of the third dams DAM3 may be different from each other. In an embodiment, the vertical dimension H1 of the first dam DAM1 may be the largest and the vertical dimension H3 of each of the third dams DAM3 may be the smallest. Conversely, the vertical dimension H1 of the first dam DAM1 may be the smallest and the vertical dimension H3 of each of the third dams DAM3 may be the largest.

Further, the first dam DAM1, each of the second dams DAM2 and each of the third dams DAM3 may be spaced apart from each other by a spacing. In this regard, the spacing between the dams DAM1, DAM2, and DAM3 means a spacing in a direction perpendicular to a length direction of each of the dams DAM1, DAM2, and DAM3. In an embodiment, a spacing P1 between the first dam DAM1 and each of the second dams DAM2 may be in a range of 10 to 200 μm. A spacing P2 between each of the second dams DAM2 and each of the third dams DAM3 may be in a range of 10 to 200 μm. The spacing P1 between the first dam DAM1 and each of the second dams DAM2 may be the same as the spacing P2 between each of the second dams DAM2 and each of the third dams DAM3. However, the disclosure is not limited thereto, and the spacing P1 between the first dam DAM1 and each of the second dams DAM2 and the spacing P2 between each of the second dams DAM2 and each of the third dams DAM3 may be different from each other. In an embodiment, the spacing P1 between the first dam DAM1 and each of the second dams DAM2 may be larger than the spacing P2 between each of the second dams DAM2 and each of the third dams DAM3. Conversely, the spacing P1 between the first dam DAM1 and each of the second dams DAM2 may be smaller than the spacing P2 between each of the second dams DAM2 and each of the third dams DAM3.

In an embodiment, the first dam DAM1 may extend continuously, and the second dams DAM2 be arranged discontinuously, and the third dams DAM3 may be arranged discontinuously. The second dams DAM2 may be spaced apart from each other. The third dams DAM3 may be spaced apart from each other.

Each of the second dams DAM2 may have a length. Each of the third dams DAM3 may have a length. In an embodiment, a length L1 of each of the second dams DAM2 may be in a range of 1 to 10 mm, and a length L2 of each of the third dams DAM3 may be in a range of 1 to 10 mm. The length L1 of each of the second dams DAM2 and the length L2 of each of the third dams DAM3 may be equal to each other. However, the disclosure is not limited thereto, and the length L1 of each of the second dams DAM2 and the length L2 of each of the third dams DAM3 may be different from each other. In an embodiment, the length L1 of each of the second dams DAM2 may be greater than the length L2 of each of the third dams DAM3. In another embodiment, the length L1 of each of the second dams DAM2 may be smaller than the length L2 of each of the third dams DAM3.

The second dams DAM2 may be spaced apart from each other by a spacing. The third dams DAM3 may be spaced apart from each other by a spacing. A spacing PP1 between the second dams DAM2 may be in a range of 1 to 10 mm. A spacing PP2 between the third dams DAM3 may be in a range of 1 to 10 mm. Spacings PP1 between adjacent ones of the second dams DAM2 may be uniform. In another embodiment, the spacings PP1 between adjacent ones of the second dams DAM2 may be non-uniform. For example, a spacing PP1 between the second dams DAM2 in one area may be greater or smaller than spacing PP1 between the second dams DAM2 in another area. Further, the spacings PP2 between adjacent ones of the third dams DAM3 may be uniform. In another embodiment, the spacings PP2 between adjacent ones of the third dams DAM3 may be non-uniform. For example, the spacing PP2 between the third dams DAM3 in one area may be larger or smaller than the spacing PP2 between the third dams DAM3 in another area. Further, the spacing PP1 between the second dams DAM2 and the spacing PP2 between the third dams DAM3 may be equal to each other. However, the disclosure is not limited thereto, and the spacing PP1 between the second dams DAM2 and the spacing PP2 between the third dams DAM3 may be different from each other. In an embodiment, the spacing PP1 between the second dams DAM2 may be larger than the spacing PP2 between the third dams DAM3. Conversely, the spacing PP1 between the second dams DAM2 may be smaller than the spacing PP2 between the third dams DAM3.

In an embodiment, the second dam DAM2 and the third dam DAM3 may partially overlap each other in a direction perpendicular to the length direction of the second dam DAM2 or the third dam DAM3 in a plan view. As shown in FIG. 9, in an embodiment, the second dam DAM2 and the third dam DAM3 may partially overlap each other in the first direction DR1 in a plan view. Further, the spacing PP2 between the third dams DAM3 may overlap the second dam DAM2 in a direction perpendicular to the length direction of the second dams DAM2 or the third dams DAM3 in a plan view. As described above, in case that organic material is applied on the display area DPA and flows to the non-display area NDA, the second dam DAM2 overlapping the spacing PP2 between the third dams DAM3 may prevent the organic material from spreading to the outer portion of the substrate.

In an embodiment, to prevent the organic material from spreading to the outer portion, an overlapping length OVL by which the third dam DAM3 and the second dam DAM2 overlap may be on a range of 1% to 50% of the spacing PP2 between the third dams DAM3. Specifically, the overlapping length OVL by which one portion of one third dam DAM3 and one portion of one second dam DAM2 overlap each other in the first direction DR1 may be in a range of 1% to 50% of the spacing PP2 between the third dams DAM3. Further, the overlapping length OVL by which one portion of another third dam DAM3 overlaps another portion of the second dam DAM2 overlap each other in the first direction DR1 may be in a range of 1% to 50% of the spacing PP2 between the third dams DAM3.

In case that a high-pressure cleaning process is performed during the manufacturing process of the display device 10, dams may be peeled off due to high-pressure cleaning. In an embodiment, opposing ends of each of the second dams DAM2 and the third dams DAM3 may be formed to have curvature in order to reduce resistance due to the high-pressure cleaning. For example, opposing ends of each of the second dams DAM2 and the third dams DAM3 may be formed to be round. In this regard, opposing ends may mean an end and another end in a length direction of each of the second dams DAM2 and the third dams DAM3. In case that each of opposing ends of each of the second dams DAM2 and the third dams DAM3 have the curvature, the resistance of the dam due to the high-pressure cleaning may be significantly reduced, thereby preventing the second dams DAM2 and the third dams DAM3 from being peeled off.

As described above, in the display device 10 according to an embodiment, the first dam DAM1 adjacent to the display area DPA may continuously extend. The second dams DAM2 and the third dams DAM3 may overlap each other in a direction. Thus, the organic material may be prevented from spreading from the display area DPA to the unwanted area of the non-display area NDA.

Further, in case that each of opposing ends of each of the second dams DAM2 and the third dams DAM3 are formed to have the curvature, this may prevent the second dams DAM2 and the third dams DAM3 from being peeled off due to the high-pressure cleaning.

Hereinafter, a display device according to another embodiment will be described with reference to other drawings.

Figure 11:
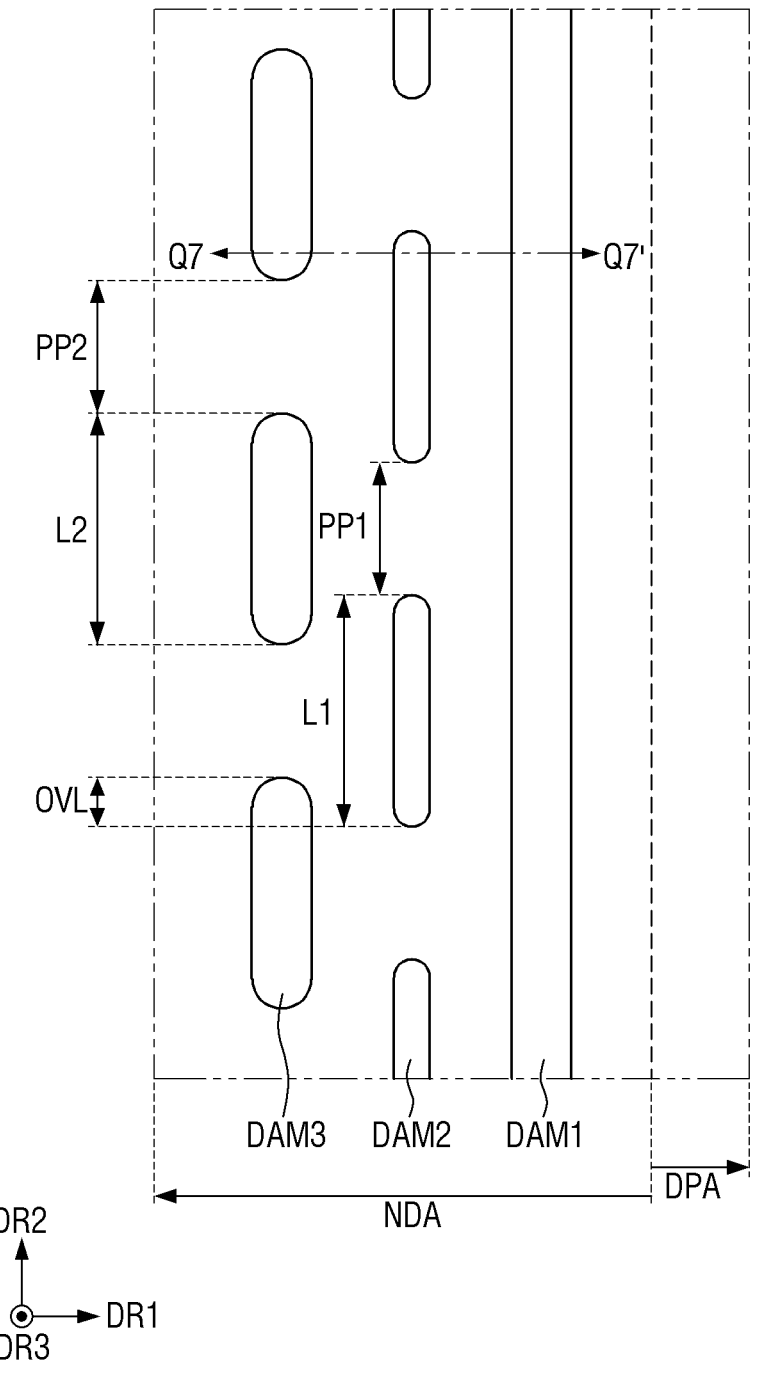
FIG. 11 is a schematic plan view showing dams of a display device according to another embodiment.
Figure 12:
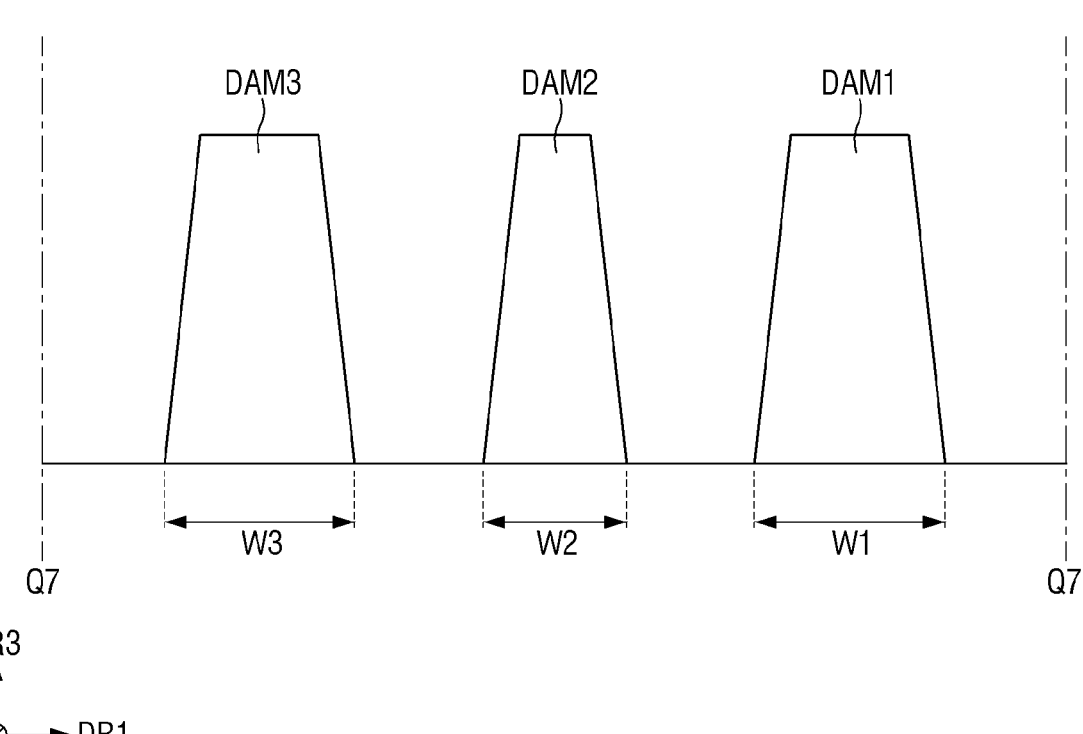
FIG. 12 is a schematic cross-sectional view taken along line Q7-Q7' in FIG. 11.

FIG. 11 is a schematic plan view showing dams of a display device according to another embodiment. FIG. 12 is a schematic cross-sectional view taken along line Q7-Q7' in FIG. 11.

Referring to FIG. 11 and FIG. 12, this embodiment may be different from an embodiment of FIG. 7 to FIG. 10 as described above at least in that in this embodiment, the width W2 of each of the second dams DAM2 may be smaller than the width W3 of each of the third dams DAM3.

Hereinafter, descriptions duplicate with those of the above-described embodiments may be omitted and the following descriptions will be made based on differences.

In an embodiment, the width W2 of each of the second dams DAM2 may be smaller than the width W3 of each of the third dams DAM3. In an embodiment, the width W2 of each of the second dams DAM2 may be in a range of about 30% to 80% of the width W3 of each of the third dams DAM3. The third dams DAM3 may be disposed at the outermost area, and thus the high-pressure cleaning solution reaches first the third dams DAM3. Accordingly, each of the third dams DAM3 may have the width W3 larger than the width W2 of each of the second dams DAM2 in order to secure a large bonding area of the third dam such that the third dam may not be peeled off due to the high-pressure cleaning.

In case that the solution for high-pressure cleaning reaches the second dams DAM2, the solution may apply, to the second dams DAM2, a relatively weaker strength than that to the third dams DAM3. The second dams DAM2 should not be peeled off due to the high-pressure cleaning. However, it may be relatively important for the second dams DAM2 to prevent overflow of the organic material in the display area DPA. Accordingly, it may be important to secure a length of the second dam DAM2, while the width W2 of the second dam DAM2 may be flexible.

In this embodiment, in case that the width W2 of each of the second dams DAM2 is smaller than the width W3 of each of the third dams DAM3, overflow of the organic material may be prevented while the peeling-off due to the high-pressure cleaning may be effectively prevented.

Figure 13:
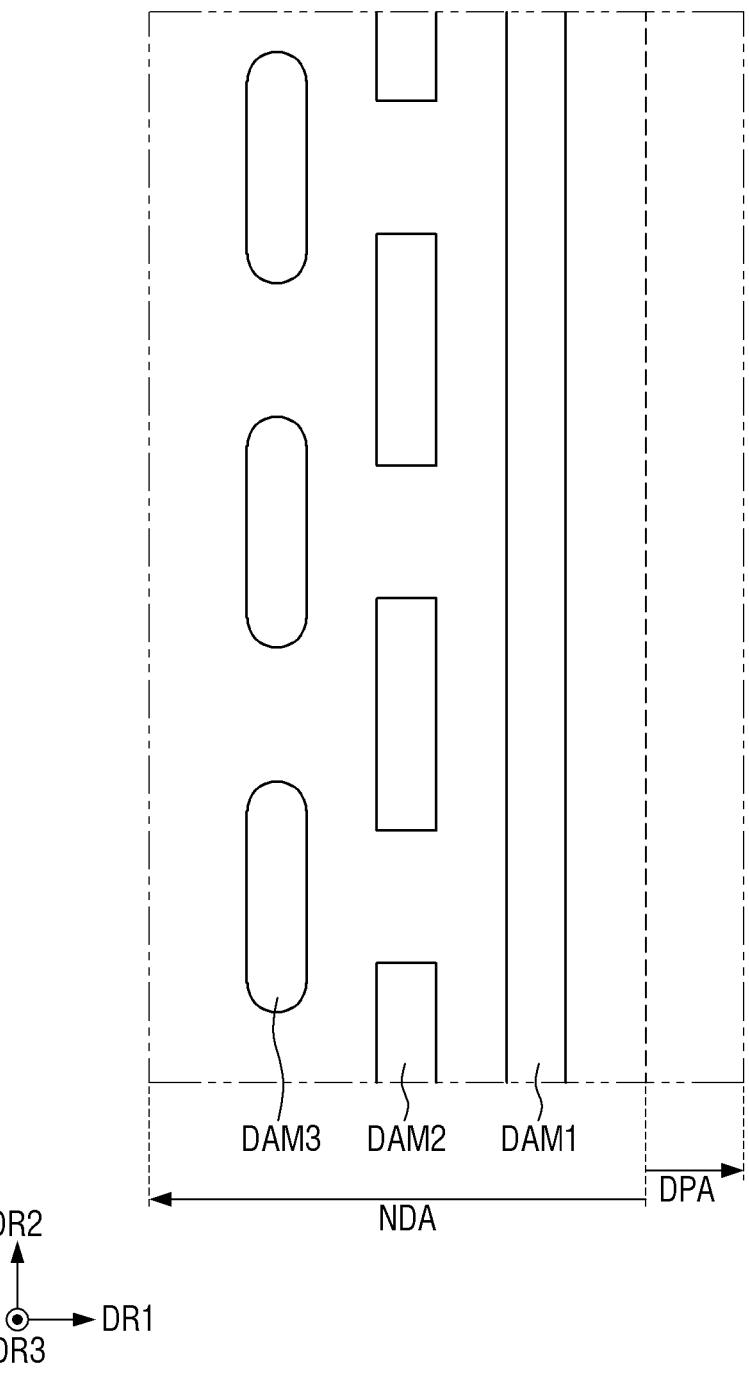
FIG. 13 is a schematic plan view showing dams of a display device according to still another embodiment.

FIG. 13 is a schematic plan view showing dams of a display device according to still another embodiment.

Referring to FIG. 13, this embodiment may be different from embodiments of FIG. 7 to FIG. 12 as described above at least in that a planar shape of each of the second dams DAM2 may be a rectangle. Hereinafter, descriptions duplicate with those of the above-described embodiments may be omitted and the following descriptions will be made based differences.

In an embodiment, the planar shape of each of the second dams DAM2 may be a rectangle. As described above in FIG. 11 and FIG. 12, in case that the solution for high-pressure cleaning reaches the second dams DAM2, the solution may apply, to the second dams DAM2, a relatively weaker strength than that to the third dams DAM3. Thus, it may be relatively important for the second dams DAM2 to prevent overflow of the organic material in the display area DPA.

Each of the second dams DAM2 may have a rectangular planar shape. For example, the planar shape of the second dams DAM2 may be a rectangle. In case that each of the second dams DAM2 is formed in a rectangle shape, an area occupied by each of the second dams DAM2 in a plan view increases, so that overflow of the organic material may be more effectively prevented by the second dam.

Each of the third dams DAM3 may be formed so that each of opposing ends thereof may have a curvature, so that the third dams DAM3 may be prevented from being peeled off due to the high-pressure cleaning.

Figure 14:
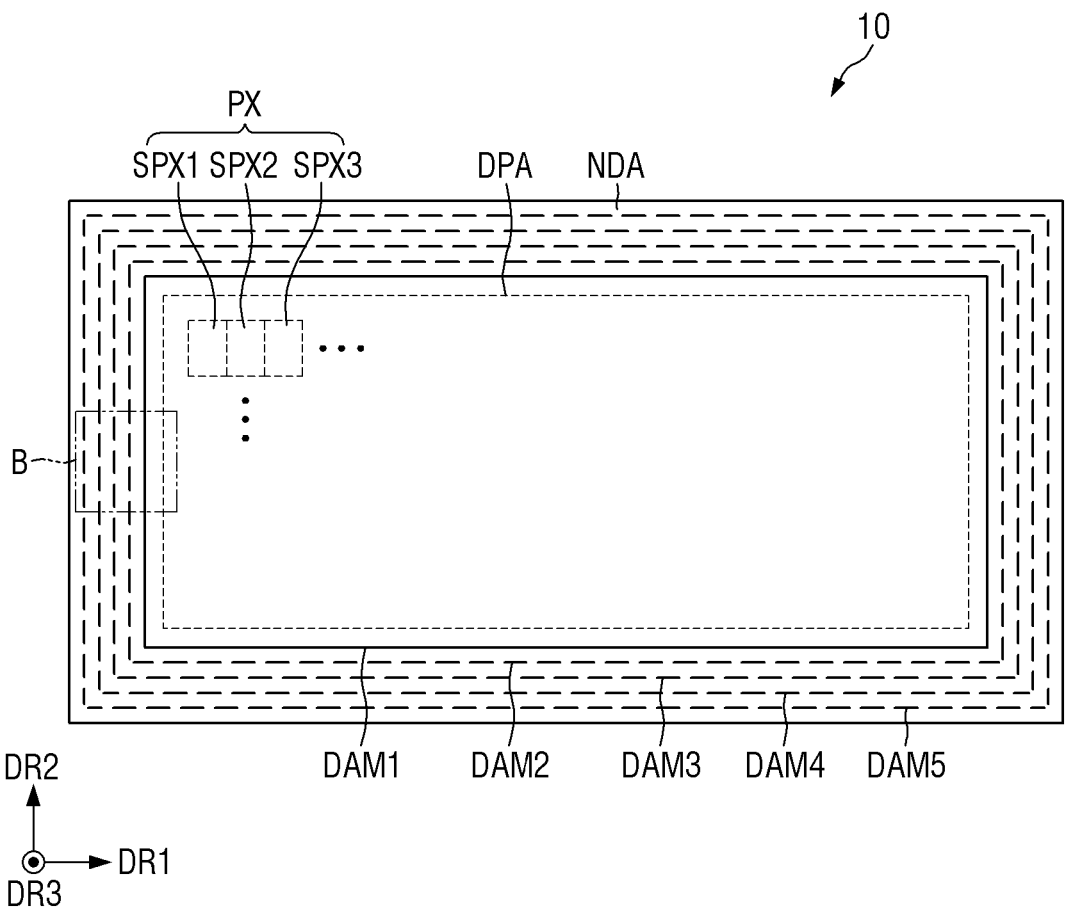
FIG. 14 is a schematic plan view schematically showing a display device according to still another embodiment.
Figure 15:
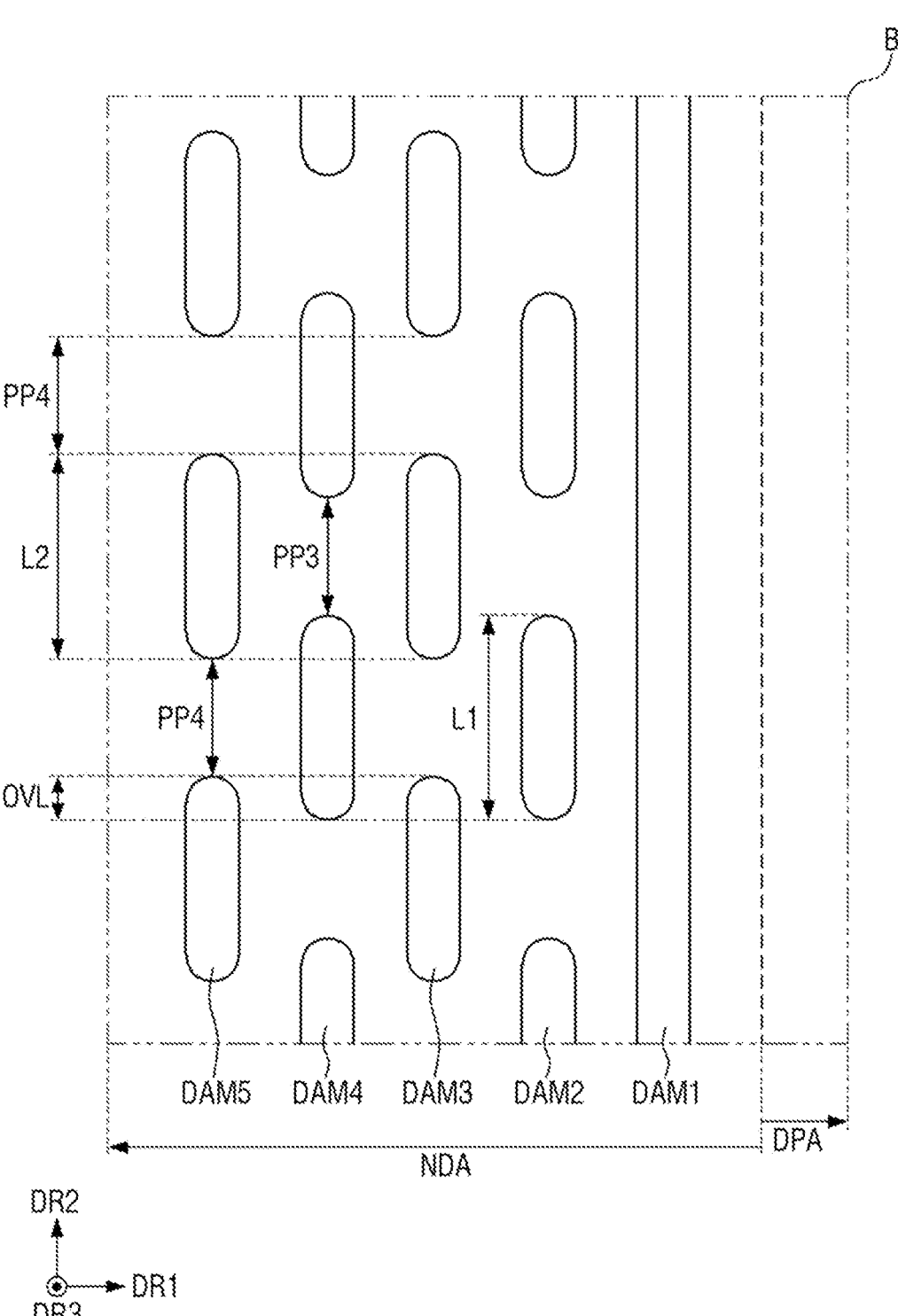
FIG. 15 is an enlarged schematic plan view of area B of FIG. 14.

FIG. 14 is a schematic plan view schematically showing a display device according to still another embodiment. FIG. 15 is an enlarged schematic plan view of area B of FIG. 14.

Referring to FIG. 14 and FIG. 15, this embodiment may be different from embodiments of FIG. 7 to FIG. 13 as described above at least in that this embodiment further includes fourth dams DAM4 and fifth dams DAM5 surrounding the third dams DAM3. Hereinafter, descriptions duplicate with those of the above-described embodiments may be omitted and the following descriptions will be made based on differences.

In an embodiment, the display device may further include the fourth dams DAM4 surrounding the third dams DAM3 and the fifth dams DAM5 surrounding the fourth dams DAM4.

The fourth dams DAM4 may be disposed to surround the display area DPA, the first dam DAM1, the second dams DAM2 and the third dams DAM3. The fourth dams DAM4 may be spaced from the display area DPA by a larger spacing than the third dams DAM3 may be and may be disposed in the non-display area NDA. The fourth dams DAM4 may include island patterns, and the island patterns may be spaced apart from each other. In an embodiment, the fourth dams DAM4 may be indicated by a dotted line in a plan view. The fourth dams DAM4 may further prevent the above-mentioned organic material from overflowing to the outer portion of the substrate SUB.

The fifth dams DAM5 may surround the display area DPA, the first dam DAM1, the second dams DAM2, the third dams DAM3 and the fourth dams DAM4. The fifth dams DAM5 may be spaced from the display area DPA by a larger spacing than the fourth dams DAM4 may be and may be disposed in the non-display area NDA. The fifth dams DAM5 may include island patterns, and the island patterns may be spaced apart from each other. In an embodiment, the fifth dams DAM5 may be indicated by a dotted line in a plan view. The fifth dams DAM5 may further prevent the above-mentioned organic material from overflowing to the outer portion of the substrate SUB.

Each of the fourth dams DAM4 and the fifth dams DAM5 may be formed to have width, vertical dimension, spacing, and length, which may have the same range as those of the second dams DAM2 or the third dams DAM3 as above-described.

In an embodiment, the fourth dams DAM4 may overlap the third dams DAM in a direction perpendicular to the length direction of each of the third dams DAM3 in a plan view. As shown in FIG. 15, in an embodiment, the fourth dams DAM4 and the third dams DAM3 may overlap each other in the first direction DR1 in a plan view. Further, a spacing PP3 between the fourth dams DAM4 may overlap one of the third dams DAM3 in a direction perpendicular to the length direction of each of the second dams DAM2 or the third dams DAM3 in a plan view. As described above, in case that the organic material is applied on the display area DPA and flows to the non-display area NDA, the third dam DAM3 overlapping the spacing PP3 between the fourth dams DAM4 may prevent the organic material from spreading to the outer portion.

The fifth dams DAM5 may overlap the fourth dams DAM4 in a direction perpendicular to the length direction of each of the fourth dams DAM4 in a plan view. In an embodiment, the fifth dams DAM5 and the fourth dams DAM4 may overlap each other in the first direction DR1 in a plan view. Further, a spacing PP4 between the fifth dams DAM5 may overlap one of the fourth dams DAM4 in a direction perpendicular to the length direction of each of the second dams DAM2 or the third dams DAM3 in a plan view. The fourth dam DAM4 overlapping the spacing PP4 between the fifth dams DAM5 may prevent the organic material from spreading to the outer portion.

In an embodiment, an end of each of the fourth dams DAM4 may be aligned and coincide with an end of each of the second dams DAM2 in a direction perpendicular to the length direction of each of the fourth dams DAM4. Further, an end of each of the fifth dams DAM5 may be aligned with and coincident with an end of each of the third dams DAM3 in a direction perpendicular to the length direction of each of the fifth dams DAM5. However, the disclosure is not limited thereto, and an end of each of the fourth dams DAM4 may not be aligned with an end of each of the second dams DAM2 while an end of each of the fifth dams DAM5 may not be aligned with an end of each of the third dams DAM3.

Figure 16:
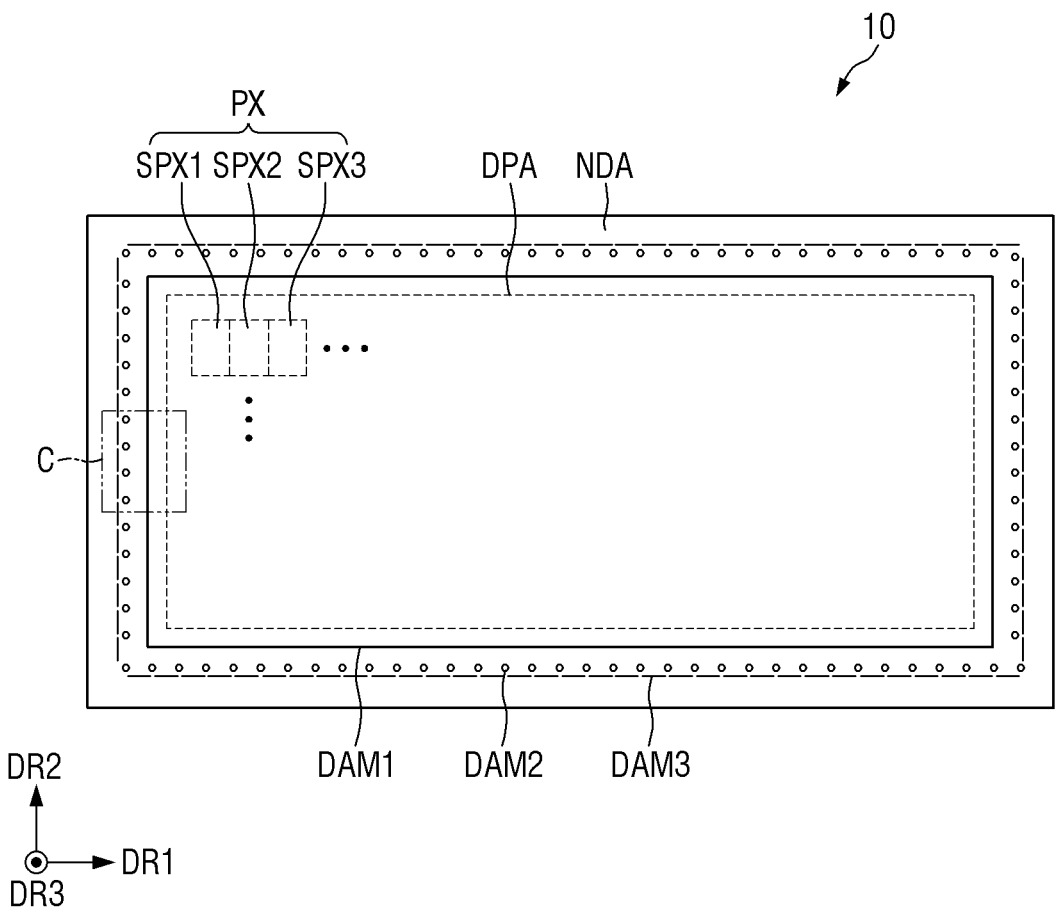
FIG. 16 is a plan view schematically showing a display device according to still yet another embodiment.
Figure 17:
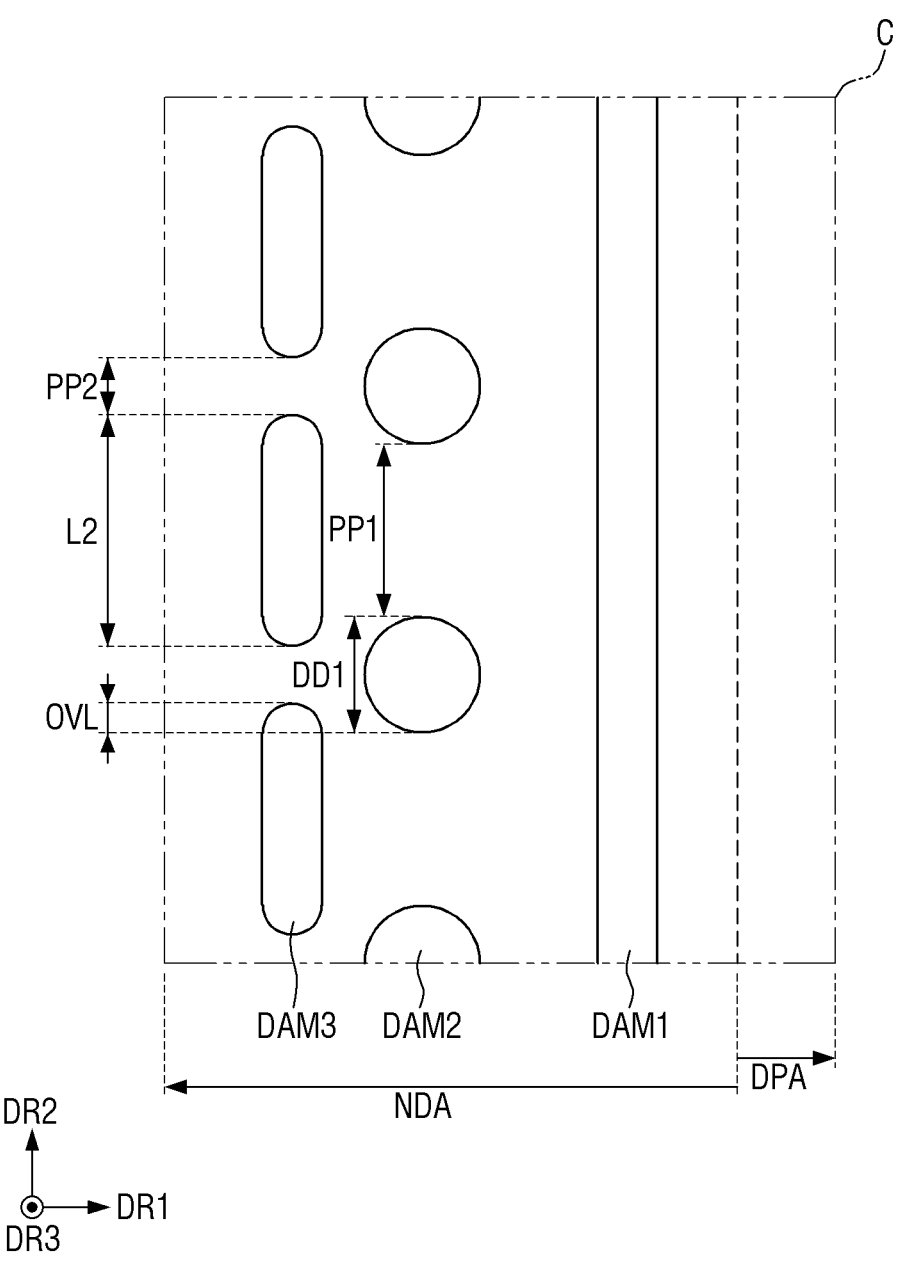
FIG. 17 is an enlarged schematic plan view of area C of FIG. 16.

FIG. 16 is a plan view schematically showing a display device according to still yet another embodiment. FIG. 17 is an enlarged schematic plan view of area C of FIG. 16.

Referring to FIG. 16 and FIG. 17, this embodiment may be different from embodiments of FIG. 7 to FIG. 15 as described above at least in that each of the second dams DAM2 may be formed in a circular shape in a plan view. Hereinafter, descriptions duplicate with those of the above-described embodiments may be omitted, and the following descriptions will be made based on differences.

In an embodiment, the second dams DAM2 may surround the display area DPA and the first dam DAM1. The second dams DAM2 may include island patterns, and the island patterns may be spaced apart from each other. In an embodiment, the second dam DAM2 may be indicated by a dot shape in a plan view. The second dam DAM2 may have a three-dimensional shape of a circular column.

The second dam DAM2 may be circular in a plan view to reduce resistance due to high-pressure cleaning. In case that the second dam DAM2 is circular in a plan view, resistance in all directions may be reduced in case that the high-pressure cleaning solution is sprayed in all directions. This may lower a probability that the second dams DAM2 are peeled off due to the high-pressure cleaning.

The second dam DAM2 may be formed to have a diameter DD1. The diameter DD1 of each of the second dams DAM2 may be larger than the spacing PP2 between the third dams DAM3, so that the overflow of the organic material from the display area DPA may be prevented. Further, the spacing PP1 between the second dams DAM2 may be larger than the length L2 of each of the third dams DAM3. The second dams DAM2 and the third dams DAM3 may overlap each other in a direction perpendicular to the length direction of each of the third dams DAM3 in a plan view. Further, the overlapping length OVL by which the third dam DAM3 and the second dam DAM2 overlap each other may be in a range of 1% to 50% of the spacing PP2 between the third dams DAM3.

As described above, each of the second dams DAM2 may be formed in a circular shape in a plan view, thereby lowering a probability that the second dams DAM2 are peeled off due to the high-pressure cleaning and preventing the organic material from overflowing from the display area DPA to the outer portion.

Figure 18:
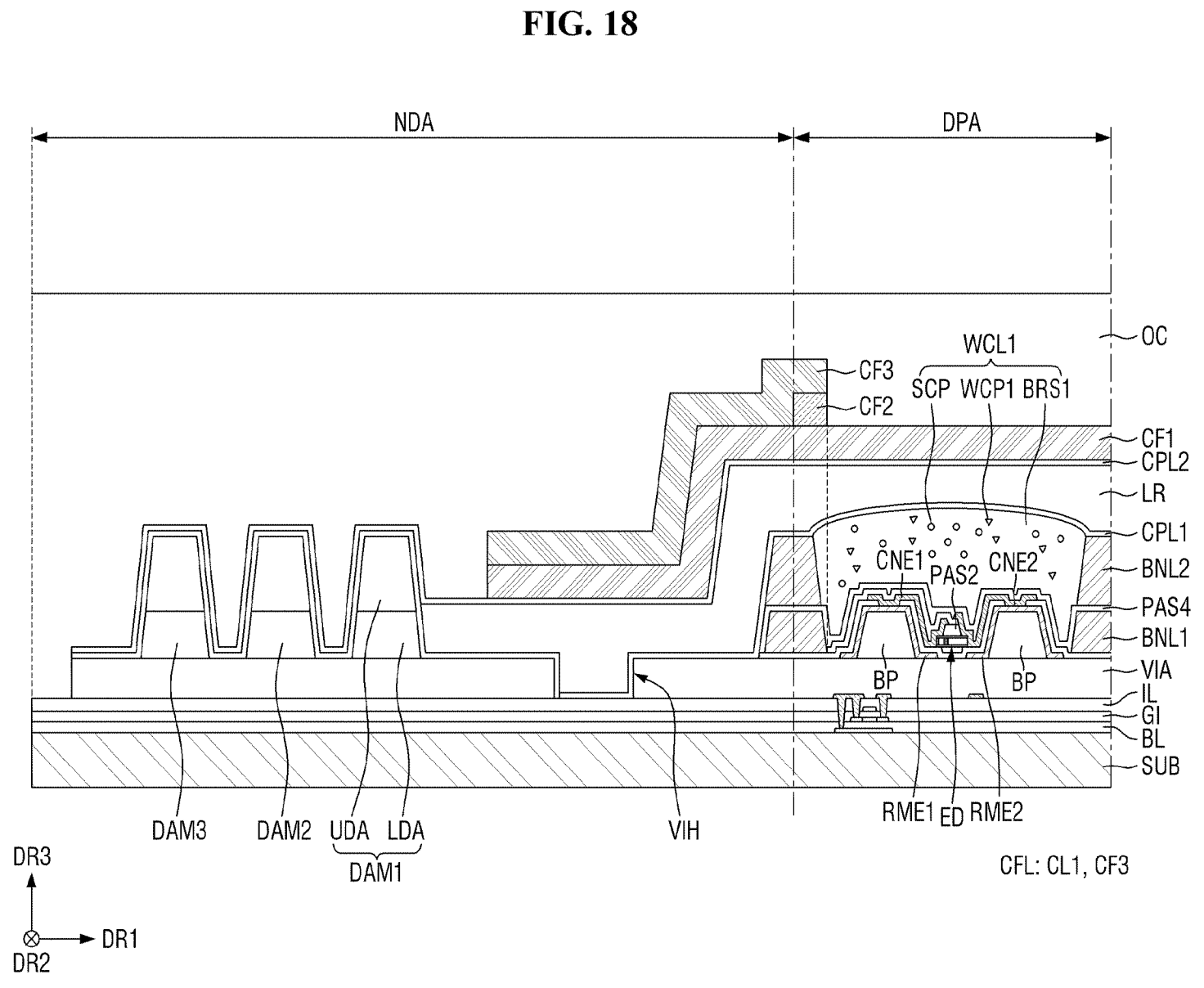

FIG. 18 is a cross-sectional view schematically showing a cross-sectional structure of a display device according to still yet another embodiment.

Referring to FIG. 18, this embodiment may be different from embodiments of FIG. 7 to FIG. 17 as described above at least in that each of the first dam DAM1, the second dams DAM2 and the third dams DAM3 may have a double-layer structure. Hereinafter, descriptions duplicate with those of the above-described embodiments may be omitted and the following descriptions will be made based on differences.

In an embodiment, the first dam DAM1, the second dams DAM2 and the third dams DAM3 may have the same stacked structure. In an embodiment, each of the first dam DAM1, the second dams DAM2 and the third dams DAM3 may have a double-layer structure. Each of the first dam DAM1, the second dams DAM2 and the third dams DAM3 may include a lower dam layer LDA and an upper dam layer UDA disposed on the lower dam layer LDA.

The lower dam layer LDA may be directly disposed on the via layer VIA. The lower dam layer LDA may include the same material as that of the first bank BNL1. A vertical level of a top face of the lower dam layer LDA may be the same as a vertical level of a top face of the first bank BNL1. In an embodiment, the lower dam layer LDA and the first bank BNL1 may be formed simultaneously in the same process.

The upper dam layer UDA may be directly disposed on the lower dam layer LDA. The upper dam layer UDA may include the same material as that of the second bank BNL2. A vertical level of a top face of the upper dam layer UDA may be the same as a vertical level of a top face of the second bank BNL2. In an embodiment, the upper dam layer UDA and the second bank BNL2 may be formed simultaneously in the same process.

In this embodiment, each of the first dam DAM1, the second dams DAM2 and the third dams DAM3 has the double-layer structure composed of the upper dam layer UDA and the lower dam layer LDA. Thus, the dam having the double-layer structure may be formed without an additional process.

Figure 19:
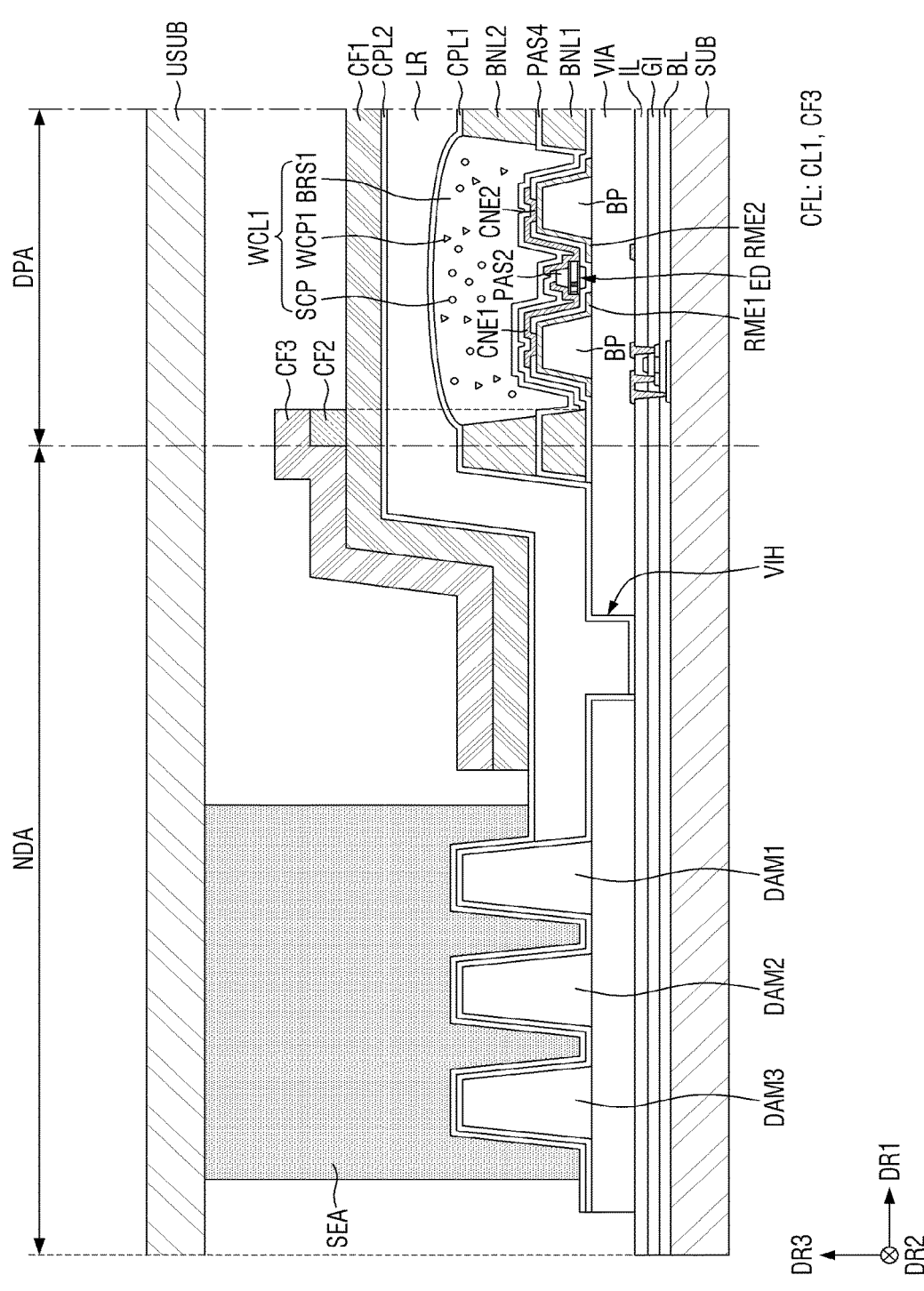
FIG. 19 is a cross-sectional view schematically showing a display device according to still yet another embodiment.

FIG. 19 is a cross-sectional view schematically showing a display device according to still yet another embodiment.

Referring to FIG. 19, this embodiment may be different from embodiments of FIG. 7 to FIG. 18 as described above at least in that this embodiment further includes an upper substrate USUB disposed above the substrate SUB and attached thereto via a bonding member SEA. Hereinafter, descriptions duplicate with those of the above-described embodiments may be omitted and following descriptions will be made based on differences.

The upper substrate USUB may face away from the substrate SUB. The upper substrate USUB may be disposed on the color filter layer CFL. The upper substrate USUB may be an insulating substrate. The upper substrate USUB may be made of a transparent insulating material such as glass, quartz, or polymer resin. Further, the upper substrate USUB may be a rigid substrate, or may be a flexible substrate capable of bending, folding, rolling, etc.

The bonding member SEA may be disposed in the non-display area NDA and between the substrate SUB and the upper substrate USUB. The bonding member SEA may overlap the non-display area NDA of the substrate SUB or the upper substrate USUB, and may bond the substrate SUB and the upper substrate USUB to each other. The bonding member SEA may include an organic material, for example a sealant.

The bonding member SEA may be disposed on the second capping layer CPL2. The bonding member SEA may be disposed directly on the second capping layer CPL2, and may overlap the dams DAM1, DAM2, and DAM3. In an embodiment, the bonding member SEA may directly contact the second capping layer CPL2 and directly contact the upper substrate USUB to bond the substrate SUB and the upper substrate USUB to each other.

In this embodiment, the dams DAM1, DAM2, and DAM3 according to the embodiments of FIG. 7 to FIG. 18 as described above may be applied to the display device 10 in which the substrate SUB and the upper substrate USUB may be bonded to each other.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
a substrate including a display area and a non-display area; and
dams disposed in the non-display area, wherein each of the dams surrounds the display area,
the dams include:
a first dam adjacent to the display area;
second dams surrounding the first dam; and
third dams surrounding the second dams,
the second dams are spaced apart from each other,
the third dams are spaced apart from each other, and
opposing ends of at least one of the second dams and the third dams has a curvature.

2. The device of claim 1, wherein
the first dam extends continuously,
the second dams are arranged to be spaced apart from each other in a length direction of each of the second dams, and
the third dams are arranged to be spaced apart from each other in a length direction of each of the third dams.

3. The device of claim 1, further comprising:
a space by which a spacing between the third dams overlaps one of the second dams in a direction perpendicular to a length direction of each of the third dams in a plan view.

4. The device of claim 3, wherein an overlapping length by which the spacing between the third dams overlaps the second dam is in a range of about 1% to about 50% of the spacing between the third dams.

5. The device of claim 1, wherein
opposing ends of each of the second dams has a curvature, and
opposing ends of each of the third dams has a curvature.

6. The device of claim 1, wherein
each of the second dams has a rectangular shape in a plan view, and
opposing ends of each of the third dams has a curvature.

7. The device of claim 1, wherein the first dam, each of the second dams and each of the third dams have a same width and a same vertical dimension.

8. The device of claim 1, wherein
each of the second dams and each of the third dams have different widths, and
the width of each of the second dams is smaller than the width of each of the third dams.

9. The device of claim 1, wherein
each of the second dams has a circular shape in a plan view, and
opposing ends of each of the third dams has a curvature.

10. The device of claim 1, further comprising:
fourth dams surrounding the third dams and spaced apart from each other; and
fifth dams surrounding the fourth dams, and spaced apart from each other.

11. The device of claim 10, wherein
a spacing between the fourth dams overlaps one of the third dams in a direction perpendicular to a length direction of each of the third dams, and
a spacing between the fifth dams overlaps one of the fourth dams in a direction perpendicular to a length direction of each of the third dams.

12. The device of claim 10, wherein
a side of one of the fourth dams is aligned with a side of one of the second dams in a direction perpendicular to a length direction of each of the fourth dams, and
a side of one of the fifth dams is aligned with a side of one of the third dams in a direction perpendicular to a length direction of each of the fifth dams.

13. The device of claim 12, wherein
each of the fourth dams and each of the second dams have a same length, a same vertical dimension and a same width, and
each of the fifth dams and each of the third dams have a same length, a same vertical dimension and a same width.

14. A display device comprising:
a substrate including a display area and a non-display area, the display area including all areas occupied by pixels and all areas directly between pixels; and
dams disposed in the non-display area, wherein each of the dams surrounds the display area,
the dams includes:
a first dam adjacent to the display area;
second dams surrounding the first dam; and
third dams surrounding the second dams,
the first dam extends continuously,
the second dams are arranged to be spaced apart from each other, and
the third dams are arranged to be spaced apart from each other,
the width of each of the second dams is smaller than the width of each of the third dams.

15. The device of claim 14, wherein
the pixels each include sub-pixels, and
each of the sub-pixels includes:
a first electrode and a second electrode that are spaced apart from each other;
a light-emitting element disposed on the first electrode and the second electrode;
a first connective electrode contacting an end of the light-emitting element;
a second connective electrode contacting another end of the light-emitting element;
a first bank defining each of the sub-pixels; and
a second bank disposed on the first bank.

16. The device of claim 15, wherein
the first dam, each of the second dams and each of the third dams is composed of a single layer, and
the first dam, each of the second dams and each of the third dams, and the second bank include a same material.

17. The device of claim 15, wherein the first dam, each of the second dams and each of the third dams is formed of multi layers, including:
a lower dam layer; and
an upper dam layer disposed on the lower dam layer.

18. The device of claim 17, wherein
the lower dam layer and the first bank include a same material, and
the upper dam layer and the second bank include a same material.

19. The device of claim 15, wherein the light-emitting element includes:
a first semiconductor layer;
a second semiconductor layer disposed on the first semiconductor layer; and
a light-emitting layer disposed between the first semiconductor layer and the second semiconductor layer.

20. The device of claim 14, further comprising:

an upper substrate facing away from the substrate; and a bonding member for bonding the substrate and the upper substrate to each other, wherein the bonding member overlaps at least one of the first dam, each of the second dams, and each of the third dams.

21. An electronic device comprising:

a substrate including a display area and a non-display area; and dams disposed in the non-display area, wherein each of the dams surrounds the display area, the dams include:

a first dam adjacent to the display area;

second dams surrounding the first dam; and third dams surrounding the second dams, the second dams are spaced apart from each other, the third dams are spaced apart from each other, and opposing ends of at least one of the second dams and the third dams has a curvature.

* * * * *